United States Patent [19]
Aoki et al.

[11] Patent Number: 5,574,289
[45] Date of Patent: Nov. 12, 1996

[54] SEMICONDUCTOR OPTICAL INTEGRATED DEVICE AND LIGHT RECEIVER USING SAID DEVICE

[75] Inventors: Masahiro Aoki, Kunitachi; Hirohisa Sano, Kokubunji; Shinji Sakano, Yokohama; Makoto Suzuki; Makoto Takahashi, both of Kokubunji; Kazuhisa Uomi, Hachiohji; Tatemi Ido; Atsushi Takai, both of Kokubunji, all of Japan

[73] Assignee: Hitachi, Ltd., Tokyo, Japan

[21] Appl. No.: 24,084

[22] Filed: Mar. 1, 1993

[30] Foreign Application Priority Data

Feb. 28, 1992 [JP] Japan .................................. 4-042831
Mar. 18, 1992 [JP] Japan .................................. 4-061774

[51] Int. Cl.$^6$ ...................... H01L 29/06; H01L 31/0328; H01L 31/0336
[52] U.S. Cl. ................................ 257/17; 257/18; 257/19; 257/22; 385/130; 385/131; 385/132; 372/50
[58] Field of Search ...................... 257/14, 15, 18, 257/19, 22, 17, 184, 190, 201; 385/129, 130, 131, 132, 8, 9; 372/50

[56] References Cited

U.S. PATENT DOCUMENTS

| | | | |
|---|---|---|---|
| 4,846,540 | 7/1989 | Kapon | 385/132 X |
| 4,918,701 | 8/1989 | Amann et al. | 372/50 |
| 5,090,790 | 2/1992 | Zucker | 257/18 X |
| 5,298,108 | 3/1994 | Miller | 257/18 X |

FOREIGN PATENT DOCUMENTS

| | | |
|---|---|---|
| 0319242 | 11/1988 | European Pat. Off. . |
| 0361035 | 8/1989 | European Pat. Off. . |
| 0469681 | 7/1991 | European Pat. Off. . |
| 0472221A2 | 8/1991 | European Pat. Off. . |
| 0472221A3 | 8/1991 | European Pat. Off. . |
| 9000915484 | 4/1990 | Japan . |
| 2237654 | 11/1989 | United Kingdom . |
| WO92/14174 | 8/1992 | WIPO . |

OTHER PUBLICATIONS

Zipperian et al., "InGaAs/GaAs, Strained–Layer Superlatice (SLS), Junction Photodetectors, LED's, Injection Laser's and FET's for Optoelectronic IC Applications," Proceedings of the IEEE International Electron Devices Meeting, Dec. 9–12, 1984, pp. 524–527.

Ishikawa, et al., "Optical Heterodyne Polarization Diversity Receiver Using A Quad–PIN PD", in Technical Research Report of The Institute of Electronic Information Communication, vol. 91, No. 340 (1991), pp. 45–50.

Stevenage, Herts., "Compressive–Strained Multiquantum––Well Waveguide Detectors For Coherent Polarisation–Diversified Receivers", Electronics Letter, 9th May, 1991, vol. 27, No. 10, pp. 838–839.

(List continued on next page.)

*Primary Examiner*—William Mintel
*Attorney, Agent, or Firm*—Antonelli, Terry, Stout & Kraus

[57] ABSTRACT

Disclosed is a semiconductor optical integrated device and method of fabricating the device, the device having a plurality of quantum well structures, formed on a single substrate, acting as optical waveguides, the plurality of quantum well structures respectively having different lattice mismatches with the substrate and/or different strains (e.g., respectively compressive strain and tensile strain). The method includes selectively depositing the quantum well structures by, e.g., organometallic vapor phase epitaxy on growth regions of the substrate, the growth regions being defined by insulating layer patterning masks, with a width of the growth regions and/or a width of the patterning mask being different for the different quantum well structures. Each quantum well structure includes quantum well layers of III-V or II-VI compound semiconductor material, the Group III or Group II elements each including at least two elements, one having a relatively large atomic diameter and another having a relatively small atomic diameter. Also disclosed is a light receiver that can independently absorb TE-mode and TM-mode light in series, which can be used in a polarized-wave diversity receiver for coherent optical communication.

23 Claims, 17 Drawing Sheets

OTHER PUBLICATIONS

Yokogawa, et al., "Low-Loss Short-Wavelength Optical Waveguides Using ZnSe-Zns Strained-Layer Superlattices", Applied Physics Letters, vol. 52, No. 2, 11th Jan., 1988, pp. 120-122.

Wang, et al., "Optical and Electrical Properties of InP/InGaAs Grown Selectively on SiO2-masked InP", Applied Physics Letters, 22nd Jul., 1991, vol. 59, No. 4, pp. 443-446.

Tanbun-EK, et al "Measurements of the Polarization Dependent of the Gain of Strained Multiple Quantum Well InGaAs-InP Lasers", in IEEE Photonics Technology Letters, vol. 3, No. 2, (Feb. 1991), pp. 103-105.

Brovelli, et al "Indium Migration and Controlled Lateral Bandgap Variations in High-Power Strained Layer InGaAs-AlGaAs Lasers Grown on Nonplanar Substrates", IEEE Journal, No. 6, (1991).

Growth of Strained InGaAs/GaAs Quantum Wells and Index Guided Injection Lawers Over NonPlanar Substrates by Molecular Beam Epitaxy, Arent, et al, Journal of Vacuum Sci. & Tech. No. 2 (1990).

"Polarisation-Independant Semiconductor Optical Amplifier Module Using Twin Grin Rod Lenses", Electronics Letters, (May 23, 1991), vol. 27, No. 11 pp. 941-943.

"1.3 μm monolithically integrated waveguide-interdigitated metal-semiconductor-metal photodetector on a GaAs substrate", Appl. Phys. Lett 56 (May 7, 1990), pp. 1892-1894.

$\lambda_{PL} \approx 1.48\mu m$
$\Delta a/a = -0.5\%$ $\lambda_{PL} \approx 1.56\mu m$
$\Delta a/a = +0.5\%$ $\lambda_{PL} \approx 1.48\mu m$
$\Delta a/a = -1.5\%$ $\lambda_{PL} \approx 1.55\mu m$
$\Delta a/a = -1.0\%$ $\lambda_{PL} \approx 1.50\mu m$  $\lambda_{PL} \approx 1.55\mu m$
$\Delta a/a = -1.0\%$  $\Delta a/a = +0.5\%$

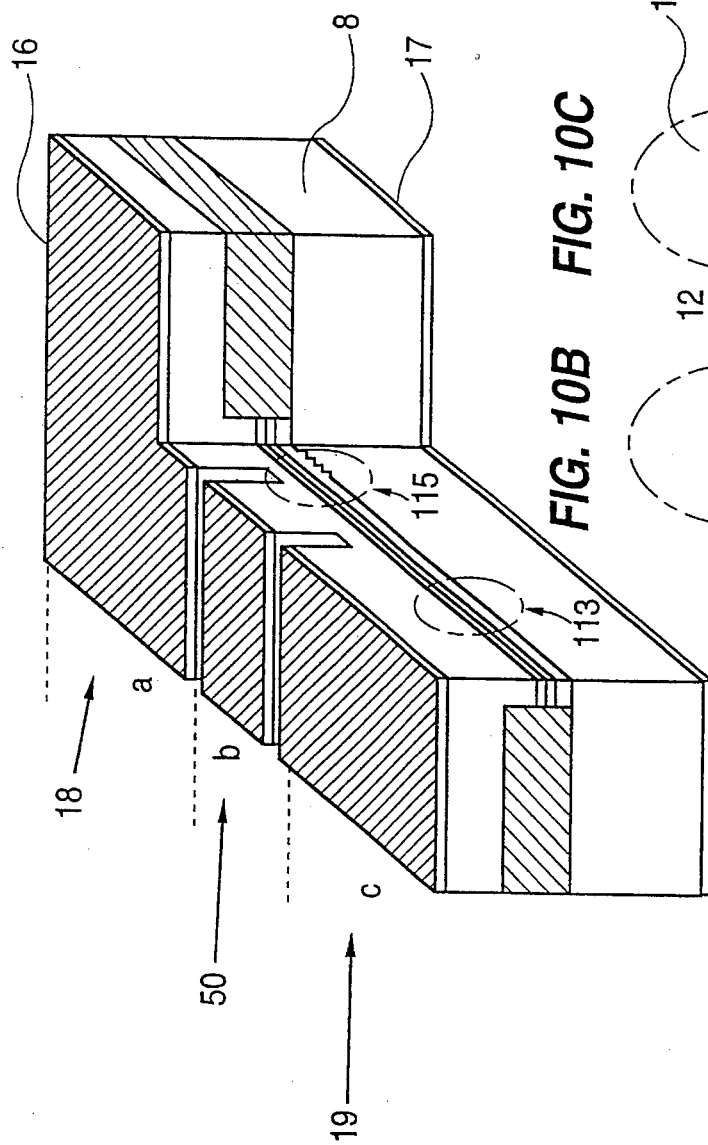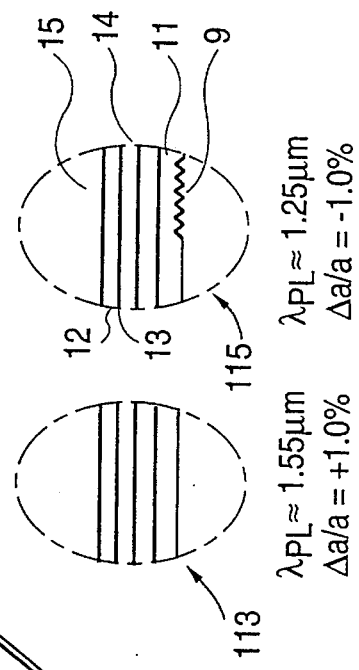

SEMICONDUCTOR OPTICAL INTEGRATED DEVICE AND LIGHT RECEIVER USING SAID DEVICE

BACKGROUND OF THE INVENTION

The present invention relates to a semiconductor optical integrated device and its fabrication method, as well as to a semiconductor optical integrated device as part of an optical communication module and optical communication system. The present invention is also directed to a light receiver, particularly to a light receiver having a structure suitable for a polarized-wave diversity light receiving system used for coherent optical communication, which light receiver can include the semiconductor optical integrated device.

It is known that the characteristics of semiconductor optical functional devices such as a semiconductor laser, an optical modulator, a light switch, an optical sensor, and an optical amplifier can greatly be improved by using a superlattice structure having optically biaxial strain.

It is estimated that monolithic integration of these devices is indispensable in the future, in order to advance optical devices such as the foregoing, and in order to advance light application techniques. However, current crystal-growth techniques cannot integrate superlattice structures having different strains, e.g., on a single substrate, and no embodiment of such semiconductor optical functional device having a superlattice structure with optically biaxial strain has been realized so far. Therefore, polarization of the activating light in an integrated device has been restricted to the TE mode (polarization plane parallel to the crystal growth surface) so far.

To integrate different functional devices on the same semiconductor substrate, however, a method is proposed which controls the band gap energy on a substrate surface by using selective area growth. This type of semiconductor optical integrated device was reported at the Autumn Meeting, C-133, of The Institute of Electronic Information Communication, held on Sep. 5, 1991.

The aforementioned method makes it possible to integrate quantum well optical Waveguides with different quantum well layer thicknesses, or different quantum levels, on a substrate surface through a single crystal growth, by crystal-growing a quantum well structure 3 having quantum well layers 5 and quantum barrier layers 6, and sandwiched by optical waveguide layer 4 and cladding layer 7, on a semiconductor substrate 2 on which an insulating mask 1 is formed. See FIGS. 1A and 1B, each showing section "a" and section "b" having quantum well optical waveguides with different quantum well structure thicknesses. In this case, however, the quantum well layer thickness and mixed crystal composition of devices to be integrated are uniquely specified, by the necessary insulating mask width. Therefore, it is impossible to control the strain on the substrate surface, and it is difficult to apply a strain system, to the quantum well structure, in which further improvement of device characteristics can be expected. Thus, it is impossible to design an optimum device structure of a quantum well layer or the like for each semiconductor optical integrated device.

Such semiconductor optical integrated devices have use in coherent optical communication systems. For coherent optical communication, signal intensity is increased by making the beam emitted from a local oscillation laser, set at the receiving side, interfere with signal light. Moreover, high-density wavelength multiplexing is achieved by using sharp-interference wavelength selectivity at the receiving side. However, to make the locally-oscillated light interfere, it is necessary to equalize the polarized light of the signal light and that of the locally-oscillated light.

Polarized-wave diversity is one of the methods to solve the problem. Polarized-wave diversity divides locally-oscillated light into two polarized lights, with an equal output by a polarized-light separator such as a polarized-light beam splitter. Signal light with any polarized-light direction, transmitted through an optical fiber, is divided into two types of polarized light perpendicular to each other to make each of them interfere with divided locally-oscillated light. Finally, the polarized light of any signal light can be received, independently of the fluctuation of interference intensity at the receiving side to the polarized light, by equalizing each divided signal intensity.

An example of structure to achieve the foregoing is shown in the "Technical Research Report" of *The Institute of Electronic Information Communication*, Vol. 91, No. 340 (1991), p. 45. In this report, two sets of polarized-wave diversity devices are used, and four light receivers (two for each set) are used because the structure of a balance-type light receiver is included. Signal light is coupled with a locally-oscillated laser beam by an optical coupler. Then, the light emitted from the optical coupler is collimated by a microlens to apply it to the polarized-light separator and divide it into two types of polarized light perpendicular to each other. Each type of divided polarized light is converted into an electric signal by a light receiver. As described above, the existing polarized-wave diversity structure necessarily requires optical parts for dividing polarized light and at least two independent light receivers. Therefore, the optical system is complicated and it is difficult to obtain a high reliability from the structure, using different optical parts.

SUMMARY OF THE INVENTION

It is an object of the present invention to provide a plurality of quantum well structures on a substrate (e.g., a single semiconductor substrate) surface, the plurality of quantum well structures having different lattice mismatch (e.g., lattice mismatch degree) with the substrate, and/or having different strains, and to provide methods of forming such plurality of quantum well structures on the substrate.

It is a further object of the present invention to provide a semiconductor optical integrated device having a plurality of quantum well structures on a substrate (e.g., a single semiconductor substrate), with different quantum well structures having different lattice mismatch with the substrate and/or different strain, and wherein the different lattice mismatch or strain can be controlled.

It is a further object of the present invention to provide a method of forming such a semiconductor optical integrated device with a plurality of quantum well structures respectively having controlled different lattice mismatch with the substrate and/or controlled different strain, the method being relatively simple with relatively few processing steps yet being able to control the different lattice mismatches and/or strains.

It is a further object of the present invention to provide a semiconductor optical integrated device having improved performance by integrating, on a substrate, a plurality of quantum well structures with different lattice mismatches with the substrate, and/or with different strains (e.g., compressive strain in one quantum well structure, and tensile strain in another quantum well structure, of the plurality of quantum well structures on the substrate), and methods of fabrication thereof.

It is a further object of the present invention to provide a semiconductor optical integrated device having a plurality of different optical waveguides (e.g., a plurality of different quantum well structures, with or without waveguide layers) on a substrate, so as to provide integration of optical waveguides with different polarization surface dependencies (e.g., capable of transmitting light of different modes and not transmitting (e.g., absorbing) light of another mode than the transmitted light), and methods of fabricating such device.

It is a further object of the present invention to provide a semiconductor optical integrated device having a plurality of different optical waveguides formed of, e.g., different quantum well structures, having different lattice mismatch with the substrate and/or having different strain, so as to control different polarization planes of activating light, and a fabrication method thereof.

It is a further object of the present invention to provide a semiconductor optical integrated device (which can be used, e.g., as a light receiver) for use in coherent optical communication systems, which device is relatively simple and has a high reliability, and which device can act to divide light into two types of polarized light perpendicular to each other.

It is a still further object of the present invention to provide a light receiver capable of independently converting two types of polarized light, perpendicular to each other, into electricity.

It is a still further object of the present invention to provide a system, including a light receiver, which can separately receive signal polarized light waves perpendicular to each other from a single light receiver input, and can equalize light intensity of a locally-oscillated light with each of the signal polarized light waves perpendicular to each other.

It is a still further object of the present invention to provide a system, including a light receiver, that can separately receive signal polarized waves perpendicular to each other through one light receiver input, and can equalize final signal outputs when the receiving sensitivity for each polarized wave differs.

The foregoing objects are achieved by the present invention, as described in the following. Various illustrative examples of the present invention, in the various aspects thereof, are presented. As can be appreciated, these illustrative examples are representative of, and are not intended to limit, the present invention, which is defined by the appended claims.

The present invention achieves the above-listed objects by providing structure including a substrate (e.g., a single semiconductor substrate) with a plurality of quantum well structures thereon, the plurality of quantum well structures having different lattice mismatch with the substrate, and/or different strains, from each other. The above objects are further achieved by semiconductor optical integrated devices with a plurality of quantum well structures, respective ones of the structures having different strains, or having different lattice mismatches (e.g., lattice mismatch degree) with the substrate.

Moreover, the above-listed-objects are further achieved by a fabrication method applying a region-selective growth (e.g., deposition) technique using an insulating film patterning mask. According to this aspect of the present invention, selective growth of, e.g., the quantum well structure is used to form a plurality of, e.g., quantum well structures on a substrate (single semiconductor substrate), with different ones of the plurality of quantum well structures having the different lattice mismatch with the substrate and/or different strains (it being within the present invention that at least one quantum well structure has a compressive strain and at least one quantum well structure has a tensile strain). The lattice mismatch and/or strain of each quantum well structure is controlled. Such control of the lattice mismatch and/or strain can be achieved by selecting predetermined widths of the growth regions on which the respective quantum well structures are deposited, and/or predetermined widths of the insulating layer patterning mask on which deposition does not take place (and which insulating layer patterning mask defines the respective growth regions).

In the foregoing, it is described that a plurality of quantum well structures are provided, on a substrate, with different strains, or with different lattice mismatches with the substrate. Such quantum well structures form optical waveguide structure of the semiconductor optical integral devices of the present invention. These quantum well structures can constitute the entirety of the optical waveguide structure; however, it is within the contemplation of the present invention that the optical waveguide structure can also include an optical waveguide layer. Within this aspect of the present invention, the optical waveguide layer can also be formed using the exposed growth regions, and can provide a support for the quantum well structure. Where the waveguide structure has both an optical waveguide layer and a quantum well structure, the combination serves as optical waveguide structure for the semiconductor optical integrated device, the combination forming a functional section. Thus, according to the present invention the device has at least first and second optical functional sections, each of which has optical waveguide structure with the different lattice mismatch and/or strain, which optical waveguide structure may or may not include the waveguide layers. In the following description, when we refer to waveguide structure we mean the combination of quantum well structure and waveguide layer, when the device has a waveguide layer; or the quantum well structure alone if the device does not have a waveguide layer.

The objects of the present invention can also be achieved by providing a waveguide-type light receiver having in series respective regions for independently absorbing two types of polarized light (TE and TM) perpendicular to each other in the optical axis. For example, a strain-free or compressive strain quantum well structure (e.g., superlattice) for absorbing only TE-mode light and transmitting TM-mode light in signal light wavelength can be arranged at a front stage as a photoelectric layer, and a structure for absorbing TM-mode light and realizing photoelectric conversion is arranged at a rear stage. A tensile-strain quantum well structure (e.g., superlattice) can be used as the TM-mode absorbing layer. The semiconductor optical integrated device of the present invention can be used to provide the quantum well structure in series respectively to absorb TE-mode light (and transmit TM-mode light) and to absorb TM-mode light.

Furthermore, two types of polarized light of locally-oscillated light entering the waveguide-type light receiver can be set so that they are tilted by 45° from a waveguide structure, and the amplification degree of them after being converted into electric signals is adjusted so that the receiving output of signal light for each type of polarized light is equalized. Or, the polarized-light angle of locally-oscillated light is deviated from 45° corresponding to a difference in the receiving sensitivity of each type of polarized light.

The advantages of a semiconductor optical integrated device having quantum well structures with different lattice mismatches with the substrate, and/or different strains, in the optical axis are listed below.

(1) When integrating a waveguide structure (e.g., quantum well structure) having a compressive strain with a waveguide structure (e.g., quantum well structure) having a tensile strain, it is possible to separately control the light (TE polarization light) having a polarization surface parallel with a crystal growth surface of a compressive-strain quantum well structure and the light (TM polarization light) having a polarization surface perpendicular to a crystal growth surface of a tensile-strain quantum well structure. Therefore, it is possible to realize an optical integrated device capable of controlling the light independently of polarization and any polarization plane of the activating light.

(2) When using a waveguide structure, having a compressive strain, as a semiconductor active device and a waveguide structure, having a tensile strain, as a semiconductor passive device, it is possible to greatly decrease the propagation loss of the tensile-strain passive waveguide structure for the TE polarization light produced by the compressive-strain active device. This is because a light-weight-hole band takes part in light absorption in a semiconductor layer having a tensile strain, and absorption of TM polarization light becomes predominant. Moreover, the same theory is effected when using a waveguide structure having a compressive strain as a semiconductor passive device and a waveguide structure having a tensile strain as a semiconductor active device.

(3) When using a waveguide structure having a tensile strain for both active and passive devices, a light-hole band affects optical characteristics including light emission, light absorption, and refractive-index change, and the activating light serves as TM polarization light. Therefore, for a light-emitting device, it is possible to improve the light emission efficiency, oscillation wavelength stability, temperature characteristics, and Operation speed. Moreover, for a passive device, it is possible to increase the absorption coefficient, refractive index change, operation speed, and activating-light output.

(4) When using the waveguide structure of the present invention for both active and passive devices, the effective mass of a heavy hole decreases to approximately $1/10$, and the heavy hole shows a same effect as a light hole. Therefore, improvement of device performance, as in Item (3) above, can be expected. As described above, a high-performance optical integrated device can be realized by combining optical integrated devices having quantum well structures with different strains, and/or different mismatches with the substrate.

According to the method of the present invention, control of the plurality of waveguide structures (e.g., quantum well structures) with different lattice mismatches on the substrate, or with different strains, can easily be achieved, through a selective epitaxial deposition of the waveguide structures (e.g., quantum well structures) on the substrate. The layers for the different waveguide structures can be simultaneously formed, with the different lattice mismatches or different strains being predetermined through, e.g., choices of width of the insulating layer defining the growth regions or choice of width of the growth regions. Thus, through choice of such widths of the growth regions and/or insulating layer, as well as the specific materials deposited and forming the waveguide structures, lattice mismatches and/or strains can easily be controlled so as to achieve objects of the present invention.

A semiconductor optical waveguide normally uses a multilayer structure and becomes a slab-shaped or rectangular optical waveguide structure. Guided light has at least two native modes—TE mode having an electric field component in the direction parallel with a surface of the waveguide and TM mode having an electric field component in the direction perpendicular to the surface of the waveguide. The guided light can be divided into two types of polarized light perpendicular to each other by providing a light receiver with a waveguide structure. Through division of the light into two types of polarized light, the receiver serves as a polarized-light beam splitter.

When providing a light receiver with a quantum well structure, the energy gap for electron transition related to TE- and TM-mode lights differs. This is because degeneracy is released and dissociated since the effective mass of electrons in the highest-order valence band related only to TE-mode light is larger than that of electrons in the valence band related to TM-mode light. And, the transition energy gap of electrons with a large effective mass related only to TE-mode light gets smaller than that of electrons related to TM-mode light. As a result, TE-mode polarized light is absorbed but TM-mode polarized light is not absorbed for the light having wavelength within the energy band gap. A region that selectively absorbs only TE-mode light can be formed by using this phenomenon. A waveguide-type light receiver for separately absorbing polarized waves perpendicular to each other can be achieved by connecting a region for absorbing TM-mode light in series with the TE-mode light selectively-absorbing region. Even if the TM-mode light absorbing region uses a material for absorbing TE-mode light, there is no problem because TE-mode light is attenuated due to absorption of TE-mode light at a front stage (i.e., prior to the TM-mode light absorbing region).

The light receiver according to this aspect of the present invention can be achieved using two waveguide structures, e.g., one having compressive strain and one having tensile strain. A strain superlattice is made by forming a semiconductor layer to a thickness of several nanometers on a semiconductor InP substrate, the semiconductor layer having a lattice constant slightly different from, and an absorption edge longer than, that of the substrate. In this case, a compressive strain occurs because a growth layer is compressed in the surface direction of the layer if the original lattice constant of the layer is larger than that of the substrate, while a tensile strain occurs because the layer is tensed in the surface direction of it if the original lattice constant of it is smaller than that of the substrate when the layer grows. When a crystal is provided with a strain, optical characteristics change because the crystal is deformed in the surface direction and the direction perpendicular to the surface. As the change of optical characteristics, the band gap wavelength of TE mode light gets longer for the compressive strain, as shown in *IEEE Photonics Technology Letters* (1991), Vol. 3, No. 2, p. 103. When a compressive strain is applied to the crystal, degeneracy is released independently of dissociation of degeneracy due to quantum effect, and the band gap energy for electron transition to absorb TE-mode light gets smaller than that for electron transition to absorb TM-mode light. Because the effect due to the compressive strain is added to the electron transition energy difference related to two types of polarized light due to the quantum effect, the loss of TM-mode light can further be decreased in the TE-mode light selectively-absorbing region. For the light with a wavelength close to a specific absorption edge, TM-mode light is hardly absorbed but is transmitted, and only TE-mode light is absorbed by using the compressive strain for the absorbing layer.

For the tensile strain, however, the band gap wavelength for electron transition mainly coupled to TM-mode light gets longer than that for electron transition to absorb only TE-mode light. When the tensile strain is used for the absorbing layer, absorption of TE-mode light decreases and that of TM-mode light increases by setting the incident wavelength to a value larger than the band gap wavelength, to absorb only TE-mode light, but smaller than the band gap wavelength of TM-mode light. Therefore, the structure of each strain layer is set so that the wavelength of incident light becomes a wavelength to be selectively absorbed. Thus, absorption of TE-mode light in the absorbing region for TM-mode light can be controlled and selectivity can be improved.

This structure requires no polarizing beam splitter, and makes it possible to monolithically form two light receivers in one body (e.g., on a single substrate).

By setting a direction of the polarized light of locally-oscillated light to 45° from a waveguide structure, an equal light intensity can be coupled for TE and TM modes, and polarized-wave diversity can be achieved.

Because propagation loss of an optical waveguide, and the structure of an absorbing region, differ for different types of polarized light, photoelectric conversion efficiency does not correspond one to one. For polarized-wave diversity, it is a key to make the efficiencies of both one-to-one. Correction of the electric-signal intensity of each type of polarized light can be realized by equalizing the amplification factor of electric signals for each type of polarized light. By making locally-oscillated light interfere with signal light, the signal light is amplified proportionally to the electric field of the locally-oscillated light. The conversion efficiency of each type of polarized light above-mentioned can also be corrected by deviating from 45° the polarized light of locally-oscillated light from the optical waveguide structure surface, and changing the percentage of the electric field coupled with TE- and TM-mode lights.

BRIEF DESCRIPTION OF THE DRAWINGS

FIGS. 10A–10C are illustrations of a fourth embodiment of the present invention, with FIGS. 10B and 10C being sectional portions of FIG. 10A;

DETAILED DESCRIPTION OF THE INVENTION

Figure 1A:
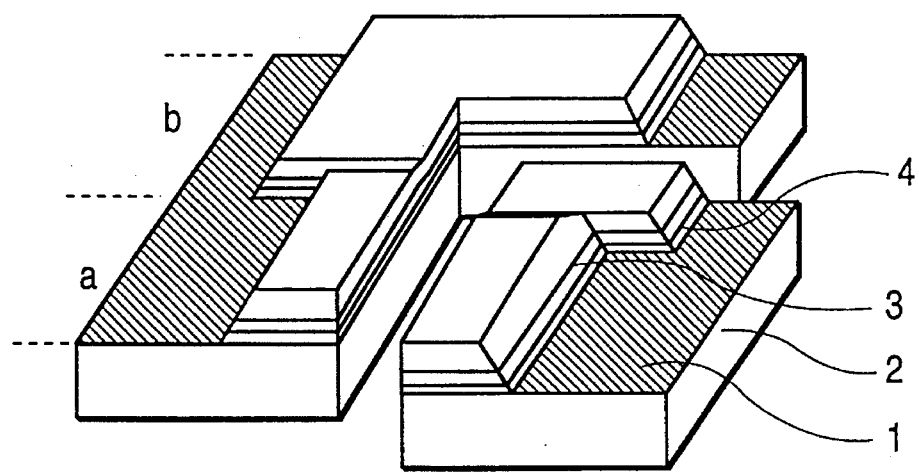
FIGS. 1A and 1B are illustrations for explaining a proposed structure.
Figure 1B:
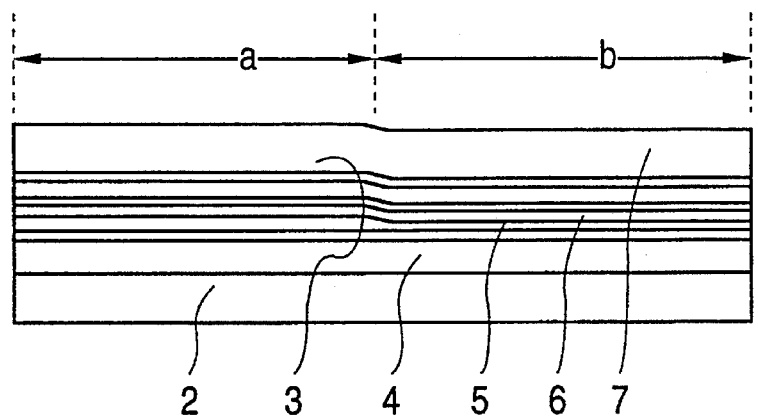

While the present invention will be described in connection with specific and preferred embodiments, it will be understood that it is not intended to limit the invention to those embodiments. To the contrary, it is intended to cover all alterations, modifications and equivalents as may be included within the spirit and scope of the invention as defined by the appended claims.

While the present invention is described in terms of apparatus, and materials, comprised of specific components, it is intended that the apparatus, and materials, can consist essentially of, or consist of, the specific components.

The following disclosure is provided in connection with the various drawing figures. In the various drawing figures, structure having substantially the same function is denoted by the same reference characters.

Figure 2A:
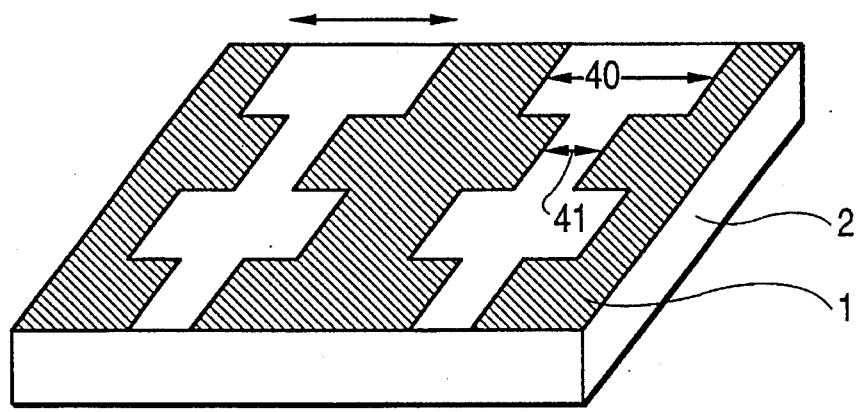
FIGS. 2A and 2B are illustrations for explaining methods according to the present invention.
Figure 2B:
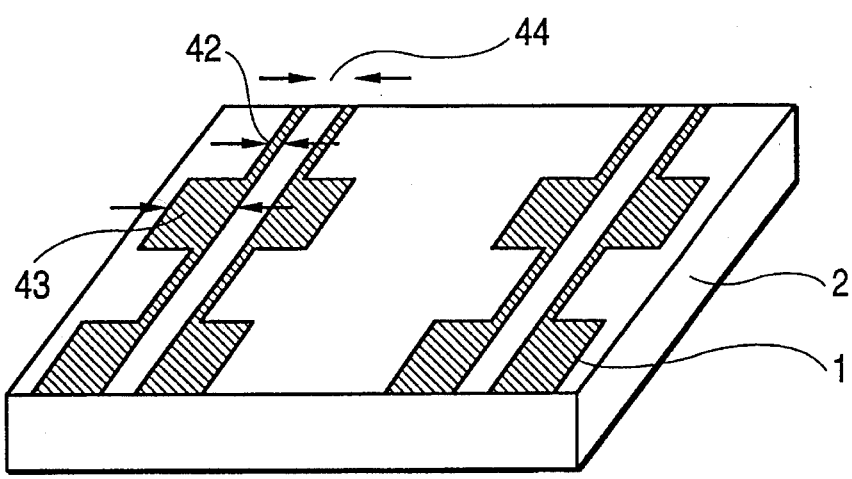

The following is the description of a method, according to the present invention, for fabricating a semiconductor optical integrated device having quantum well structures with different strains (respectively, compressive strain and tensile strain). Such different strains can be achieved, e.g., by providing quantum well structures on a substrate, having different lattice mismatch with the substrate. An insulating film patterning mask 1 made of $SiO_2$ (silicon dioxide), $SiN_x$ (silicon nitride) or a-Si (amorphous silicon) is formed on a semiconductor substrate 2, as shown in FIG. 2A or FIG. 2B, by a chemical vapor deposition technique or a sputtering technique, combined with lithography. In both cases, a portion where the semiconductor is exposed between patternings is defined as a growth region. The width of this region is defined as a growth region width, while the width of the patterning mask is defined as a mask width. In case of FIG. 2A, the insulating film patterning mask 1 is provided so that the growth region width changes in the optical-axis direction, having different widths 40, 41 for different quantum well structures to be formed. On the other hand, in FIG. 2B the insulating film patterning mask 1 is provided so that the mask width changes, having mask widths 42, 43, while the growth region width is kept constant, at width 44, in the optical-axis direction.

Figure 3A:
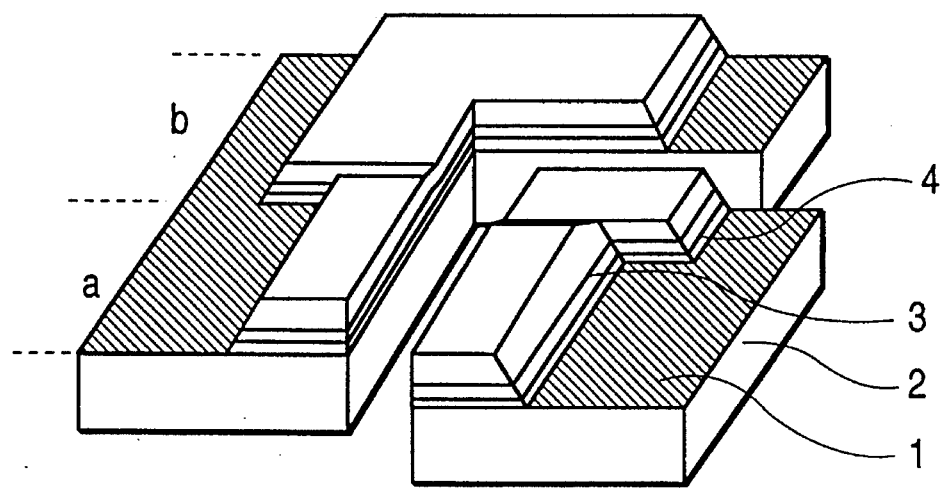
FIGS. 3A and 3B are illustrations for explaining an operation of the present invention.
Figure 3B:
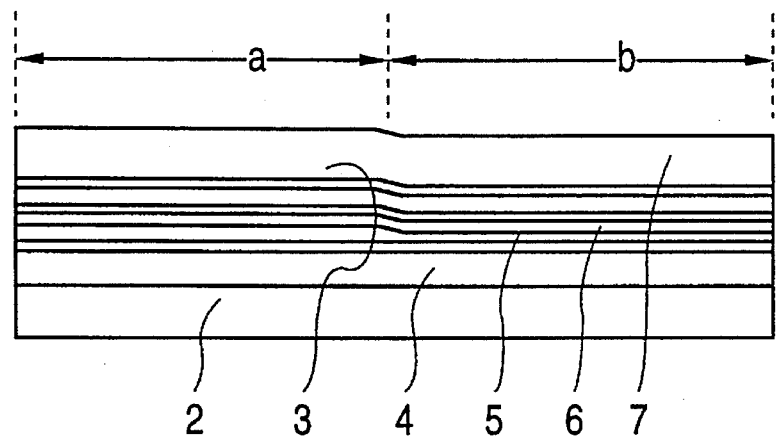

As shown in FIGS. 3A and 3B, an optical waveguide layer 4 comprising a III-V compound mixed-crystal semiconductor, quantum well structure 3 comprising a plurality of quantum well layers 5 and quantum barrier layers 6, and cladding layer 7 are provided by a known vapor phase epitaxy deposition technique (e.g., organometallic vapor phase epitaxy) in sequence on semiconductor substrate 2 having the insulating film patterning mask 1. The quantum well layer 5 should comprise two or more group III elements with different lattice constants, such as Ga and In. Such two or more Group III elements have different atomic diameters (preferably, a relatively large difference in atomic diameter) so as to achieve the desired lattice mismatch according to the present invention. While Ga and In are illustrated in the present description as the Group III elements, the present invention is not limited thereto, and, e.g., the Group III elements can be In and Al, In and Ga and Al, etc. Various growth layers of III-V semiconductor materials on a substrate, according to the present invention, are as follows:

(1) InGaAs(P)/InP (2) InGaAs/InGaAlAs (3) InGaAs/GaAlAs/GaAs (4) InAlAs/InGaAs/InP.

In this case, because no crystal growth occurs on the insulating film patterning mask, growth selectively occurs only in the growth region (selective area growth). Moreover, because growth material species attached on the insulating film patterning mask 1 are surface-diffused or vapor-phase-diffused to the growth region, the growth speed increases as the exposed area width decreases. In this case, the composition of the growth layer also changes. This is a phenomenon caused by the fact that the diffusion length differs for different elemental materials, in the same Group of the Periodic Table, especially in Group III element materials on the insulating film patterning mask 1. For example, because the diffusion length of an In material species is larger than that of the Ga material species, the In composition in crystals increases due to selective growth and the crystal lattice constant gets larger than that of the substrate. Because the magnitude of diffusion length and lattice constant depends on the combination of Group III elements, the crystal lattice constant may get smaller than that of the substrate due to selective area growth. The thickness, and the composition, of these growth layers respectively increases and changes as the growth region width increases. Therefore, the composition of a quantum well structure on the substrate surface, e.g., lattice mismatch thereof with the substrate and/or strain of the quantum well structure, can easily be controlled with the growth region width by positively using the composition change.

Moreover, a high-performance semiconductor optical integrated device having a plurality of quantum well structures respectively with different strains can be fabricated on the substrate surface by using the above technique. Concretely, for crystal growth of the quantum well structures shown in FIG. 3A, the crystal lattice constant of the quantum well layer 5 is previously set smaller than that of the quantum barrier layer 6 in the section "b" having a large growth region width, to form a quantum well structure having a tensile strain in the quantum well layer as shown in FIG. 3B. In this case, a quantum well structure having a compressive strain is automatically formed in the quantum well layer in the section "a" having a small exposed area width because of the composition change previously mentioned. Because the optical waveguide layer 4, quantum barrier layer 6, and cladding layer 7 use an alloy crystal semiconductor with a Group III element composition ratio of 1 or less, no great difference of growth layer composition is produced between two sections "a" and "b". For example, when both In and Ga, which are Group III elements, have the composition ratio of around 0.5 in $In_xGa_{1-x}AsP$, change of the layer thickness and composition increases in the two sections. However, the change decreases as the composition ratio of any element increases. A Group III element contributes to an extraordinarily large degree to change of the layer thickness and composition of the Group III-V Compound semiconductor, in selective area growth, as compared with a Group V element. When assuming the composition ratio of the same group elements A and B as [A] and [B] respectively, a large change is obtained when the value of "x" defined as "x"=[A]/[B] ranges between 0.25 and 4 (both inclusive), and the maximum change is obtained when it equals "1". In this case, because the feed gas composition forming the alloy-crystal semiconductor crystal is different; and because migration/diffusing, of the atoms constituting the alloy crystal, differ for different elements on the insulating layer patterning mask depending on the exposed area width, a quantum well structure 3 is automatically formed on the exposed areas of the sections "a" and "b" with different composition and thickness. The sections "a" and "b" are very smoothly coupled because both sections are formed through the same crystal growth, the coupling loss is greatly decreased, and optical coupling efficiency reaches approximately 100%.

In order to achieve migration (e.g., diffusion) of the desired elements, in depositing the quantum well structures on the substrate by, e.g., vapor phase deposition, the deposition temperature and pressure have an effect. Thus, it is preferred that the deposition take place at a temperature of at least 550° C. (more preferably 550°–650° C.), and a pressure of 20–200 Torr. Illustratively, the deposition (e.g., of the quantum well structures) can be performed at a temperature of 600° C., and pressure of 40 Torr.

As indicated previously, width of the growth region, and of the mask (insulating layer width), affect the lattice mismatch and/or strain of the deposited layer. Desirably, the width of the growth region (40 or 41 in FIG. 2A, or Wg (44) in FIG. 2B) ranges from 5–30 μm, and/or the width of the mask (insulating layer width, e.g., Wm (42 or 43) in FIG. 2B) ranges from 5–60 μm. Illustratively, Wg can range from 5–30 μm, and Wm range from 5–60 μm, for a quantum well structure deposited on a substrate.

Figure 4:
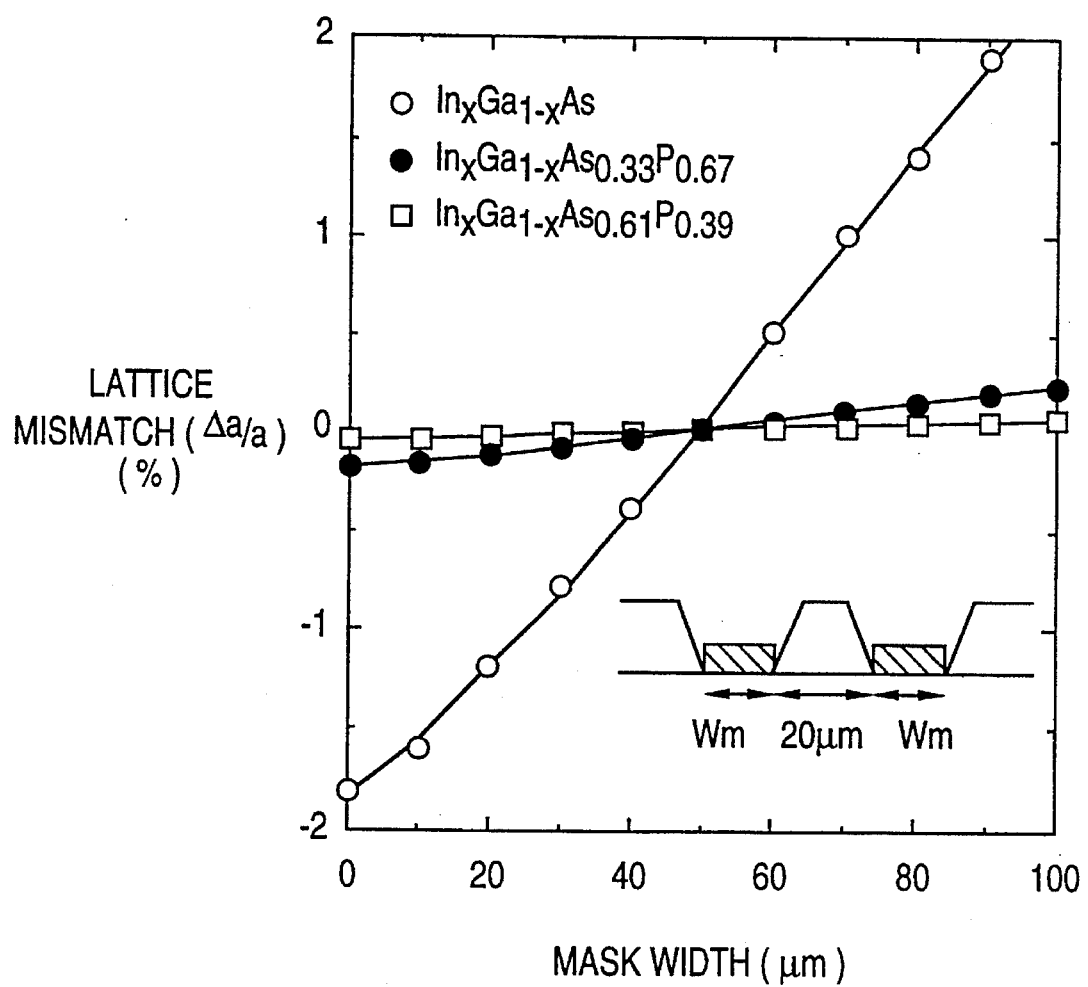
FIG. 4 is a diagram showing how lattice mismatch of a deposited structure on a substrate varies dependent upon a mask width (insulating layer width) defining the growth region for the deposited structure.

FIG. 4 illustrates the results of an examination of the lattice mismatch degree of the growth layer with the substrate, as a function of the patterning mask width, when depositing the growth layer, i.e., an InGaAsP quaternary layer or a InGaAs tertiary layer, by organometallic vapor-phase epitaxy on an InP substrate, keeping the growth conditions such as the amount of gas to be fed and the growth temperature constant. As shown by the illustration in FIG. 4, crystal growth is performed under the conditions in which lattice mismatch is negative when the mask width is zero, or for the normal growth, and lattice matching occurs when the mask width is 50 μm by keeping every growth region width at 20 μm. As shown in FIG. 4, it is possible to optionally set a plurality of quantum well structures with different strains on the same substrate by setting the mask width to different values.

Figure 5A:
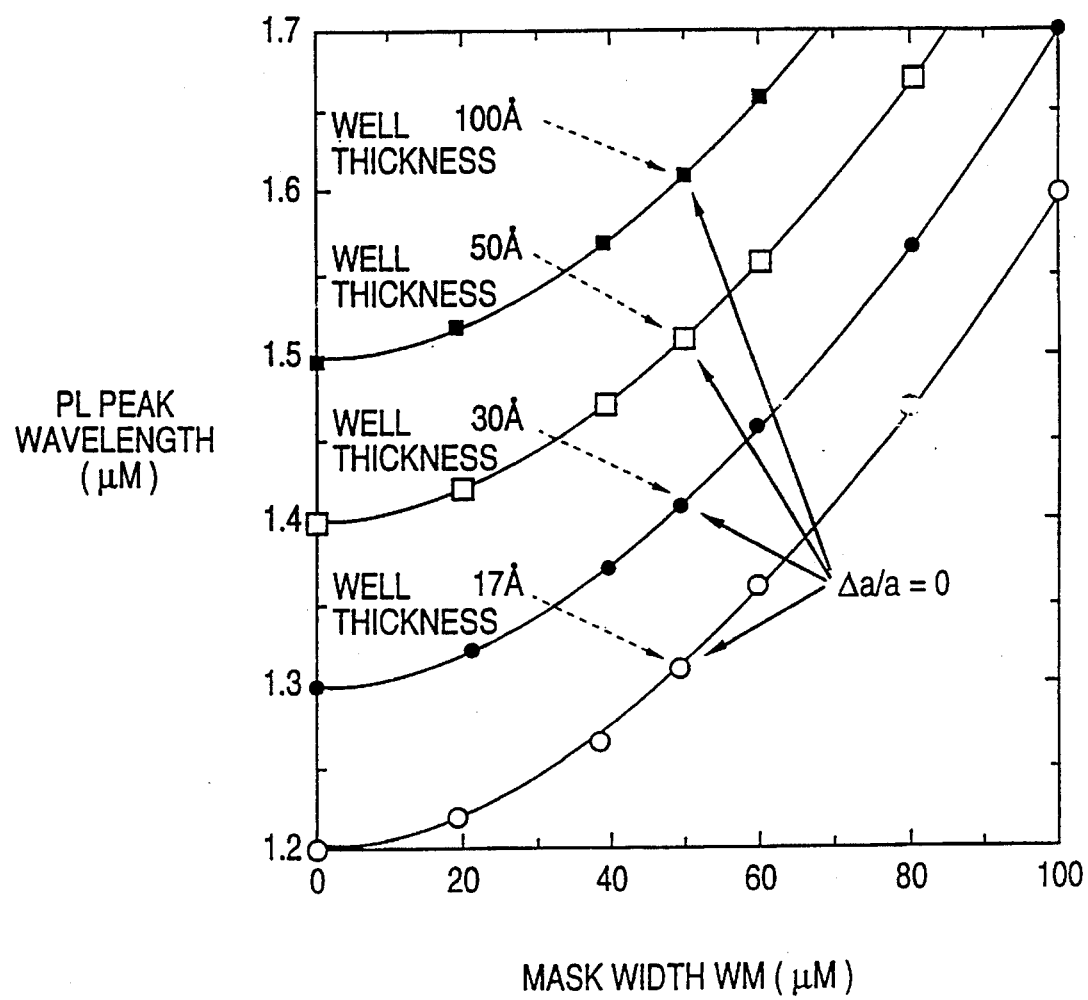
FIG. 5A is a diagram showing how bandgap energy of a quantum well structure varies dependent upon the mask width (insulating layer width) defining the growth region for the deposited quantum well structure, and dependent upon the thickness of the quantum well structure.
Figure 5B:
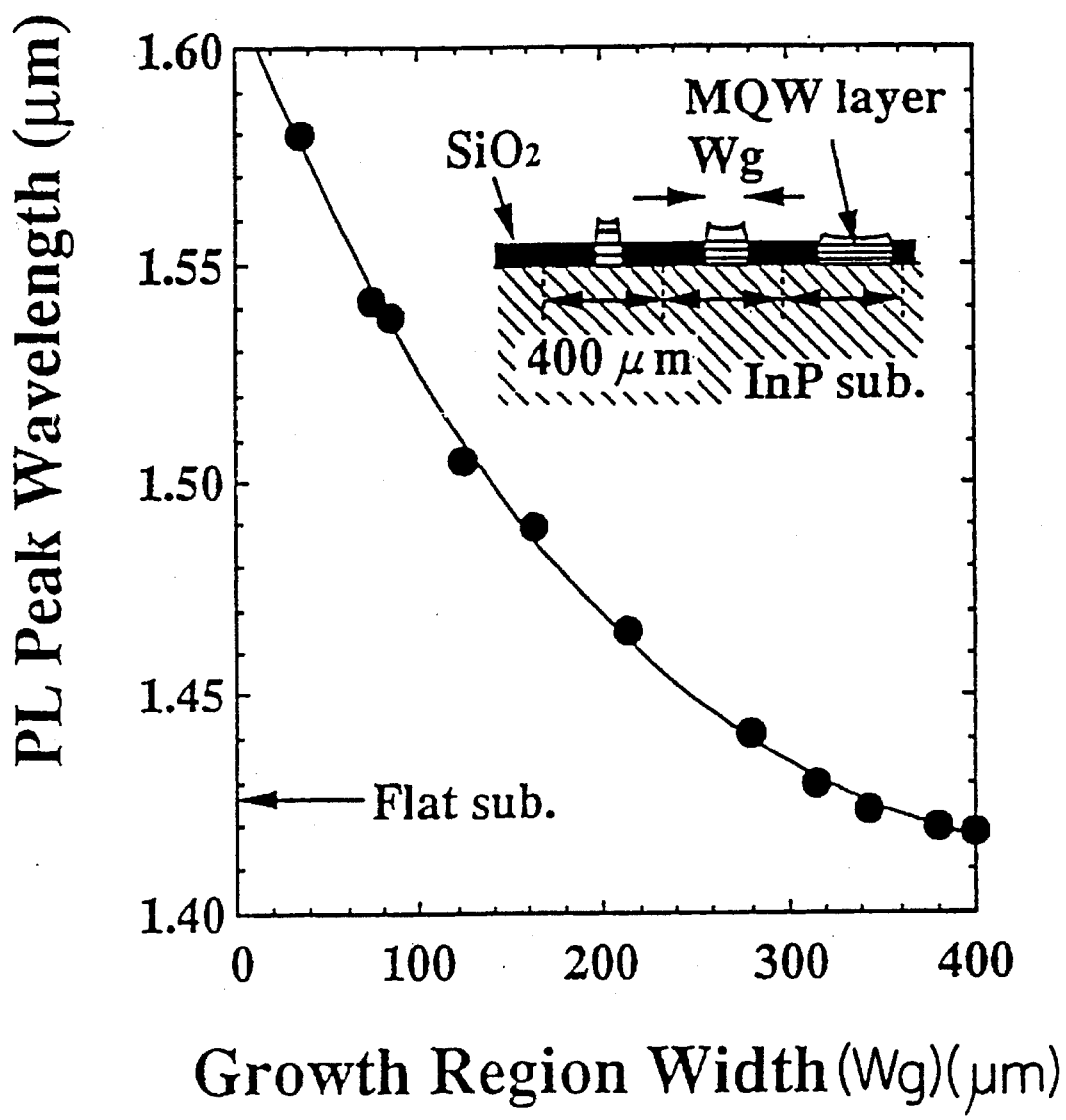
FIG. 5B is a diagram showing how bandgap energy of a quantum well structure varies dependent upon the growth region width.

FIG. 5A illustrates the change of bandgap energy (expressed as PL peak wavelength) of a quantum well structure due to increase of quantum well layer thickness and the previously-mentioned change of well layer composition. FIG. 5B illustrates the change of bandgap energy (expressed as PL peak wavelength) of a quantum well structure due to increase in growth region width. For a proposed method, the bandgap energy control width is restricted to approximately 100 meV because only the bandgap energy reduction effect due to compressive strain is used. For the present invention, however, the energy gap width can be increased up to two times the existing value by also using negative strain. Therefore, the degree of freedom of design for application of the technique to optical integrated devices is greatly improved.

As seen in FIG. 3, the quantum well structure includes both quantum well layers 5 and quantum barrier layers 6. Both the quantum well layers and quantum barrier layers are deposited using the selective growth regions, and compositions of each are dependent upon the mask width. However, as seen in FIG. 4, composition of the quantum well layers varies to a much greater extent, dependent upon mask width, as compared to that of the quantum barrier layers.

In the foregoing description, a III-V semiconductor material has been used for forming the quantum well structure (including quantum well layers thereof). However, the present invention is not limited to use of III-V semiconductor materials. For example, other compound semiconductor materials, including II-VI semiconductor materials, can be used. When using II-VI materials, at least two Group II elements are to be incorporated in the material, the at least two Group II elements having different atomic diameters (at least one being relatively larger than the others). Similar to the discussion previously in connection with the III-V semiconductor materials, the Group II element having the relatively large diameter is selectively incorporated in the growth layer formed on a growth region defined by a patterned mask, so as to form growth layers with different compositions and thereby achieve objectives of the present invention. Illustrative Group II elements include Mg, Zn and Cd; and illustrative Group VI elements include Se, Te and S.

Embodiments of the present invention are described below by referring to FIGS. 6 to 17.

Embodiment 1

Figure 6:
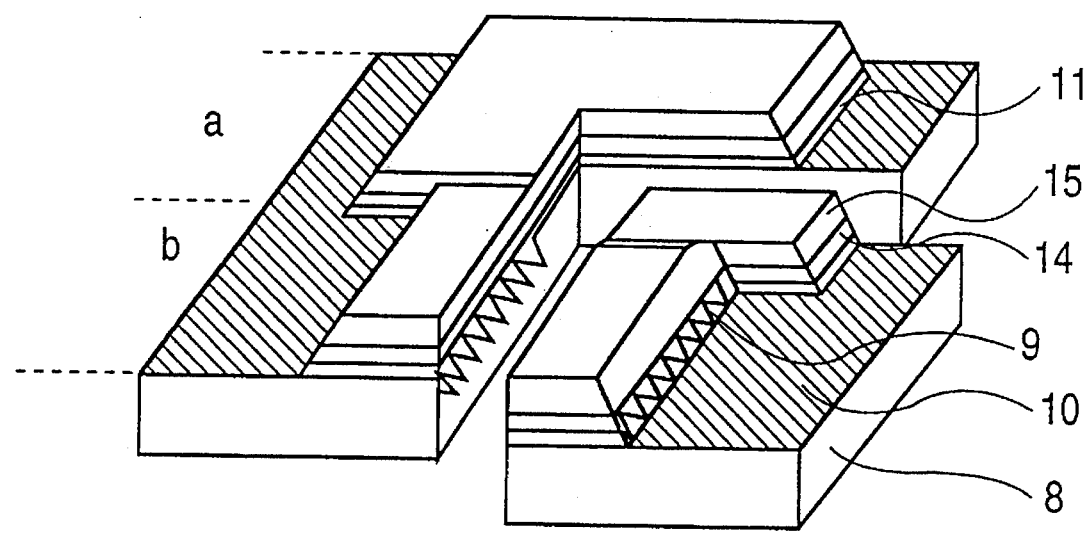
FIG. 6 is an illustration for explaining a first embodiment of the present invention.

In FIG. 6, an insulator patterning mask 10 comprising $SiO_2$, $SiN_x$, or a-Si is formed on an n-InP substrate 8, in which a region where the semiconductor substrate is exposed (growth region width) differs in the optical waveguide direction between a region where a grating 9 is to be formed (section "b", for forming a distributed feedback laser) and a region where it is not formed (section "a", for forming an optical modulator). Then, an $In_{0.85}Ga_{0.15}As_{0.33}P_{0.67}$ quaternary waveguide layer 11, a multiple quantum well structure 14 (e.g., having 10 quantum well layers) comprising $In_xGa_{1-x}As$ tertiary quantum well layer 12 and $In_{0.85}Ga_{0.15}As_{0.33}P_{0.67}$ quaternary quantum well barrier layer 13, and a p-InP cladding layer 15 are crystal-grown in order on the patterning substrate through an organometallic vapor-phase epitaxy method. By setting the exposed area width of two regions (section "a" and section "b") to 45 μm and 60 μm, respectively, from FIG. 4, the gain peak wavelength is set to 1.48 μm and 1.56 μm, respectively, and the lattice distortion of the quantum well structure (Δa/a) is set to −0.5% and +0.5%, respectively. After forming each semiconductor layer, the semiconductor layers and the insulating layer patterning mask are etched to form the waveguide structure, and then the waveguide structure is buried by conventional techniques. Illustratively (and not limiting), Fe-doped InP or Ti-doped InP can be used as materials for burying the waveguide structure. Thereafter, a p-electrode 16 and n-electrode 17 (see FIG. 7A) are formed through a conventional vapor deposition method, to obtain a semiconductor optical integrated device.

A field-absorption-type modulator integrated light source can be realized by using the above structure as an optical modulator (section "a") and distributed feedback laser (section "b"). In this structure, having an optical modulator with tensile-strained quantum well structure, laser light from the distributed feedback laser (which has a compressive-strained quantum well structure) is transmitted through the optical modulator when no voltage is applied to the optical modulator, and the optical modulator absorbs the laser light when a voltage is applied to the optical modulator.

Figure 7A:
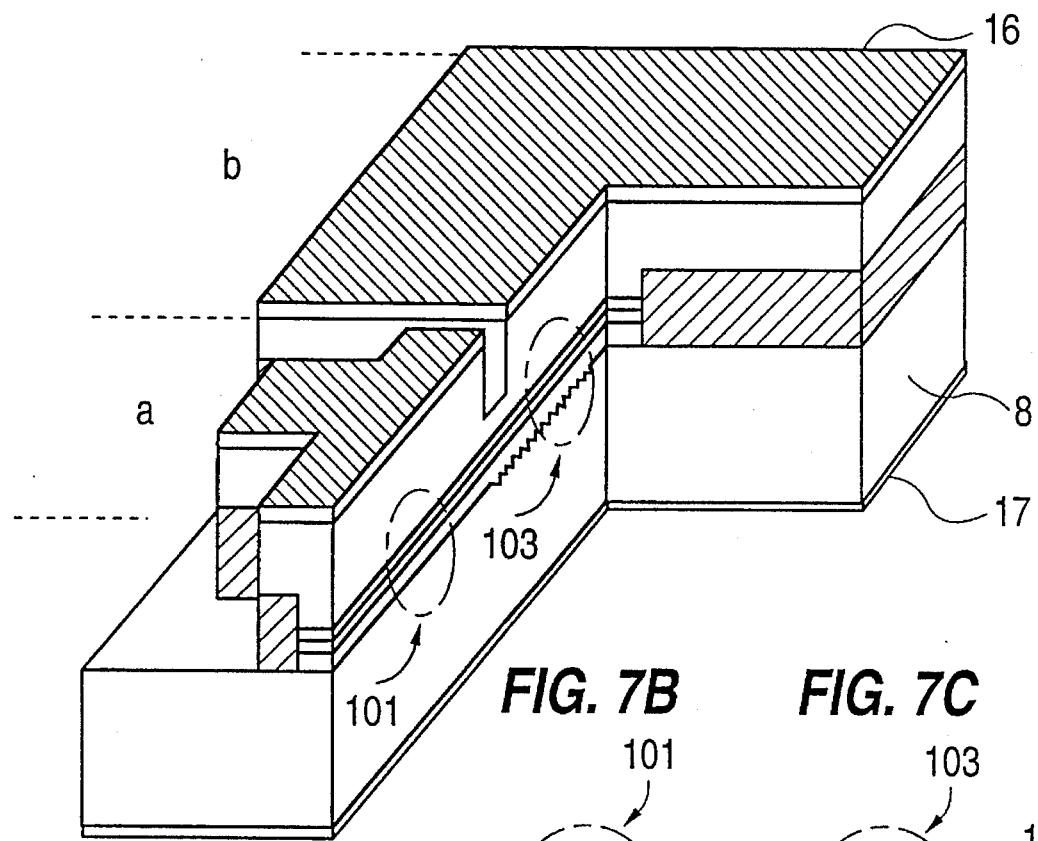
FIGS. 7A–7C illustrate a completed structure utilizing the first embodiment, with FIGS. 7B and 7C being sectional portions of FIG. 7A.
Figure 7B:
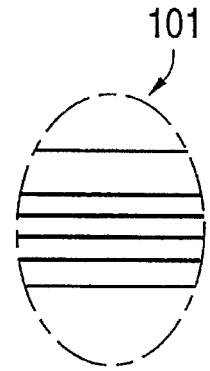
Figure 7C:
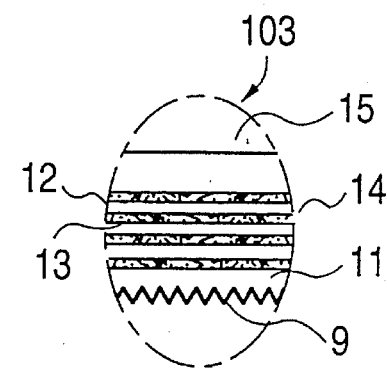

FIGS. 7A–7C show the device structure of the embodiment made by further introducing a recessed structure and current constriction structure through a known method. FIGS. 7B and 7C respectively show the section portions 101 and 103 of FIG. 7A. It is possible to increase the quantum well layer thickness to 60 Å, which is 1.5 times larger than the value for no strain, while keeping the gain peak wavelength at 1.48 μm, by introducing tensile strain to the modulator. Thus, section 101 has a gain peak wavelength of 1.48 μm and a tensile strain (Δa/a)=−0.5%; and section 103 has a gain peak wavelength of 1.56 μm and a compressive strain (Δa/a)=+0.5%. Because the field absorption effect is proportional to the fourth power of the well layer thickness, it increases five times. Thereby, it is possible to decrease the modulator driving voltage to ½ the existing value, and the chirping for modulation to approximately 1/10 the existing value. Thus, an optical integrated device with a high performance and reliability can be realized.

In the foregoing embodiment, two quantum well structures are provided. As can be appreciated, the present invention is not limited to two quantum well structures on a substrate, and can include more than two quantum well structures on the substrate.

Embodiment 2

Figure 8A:
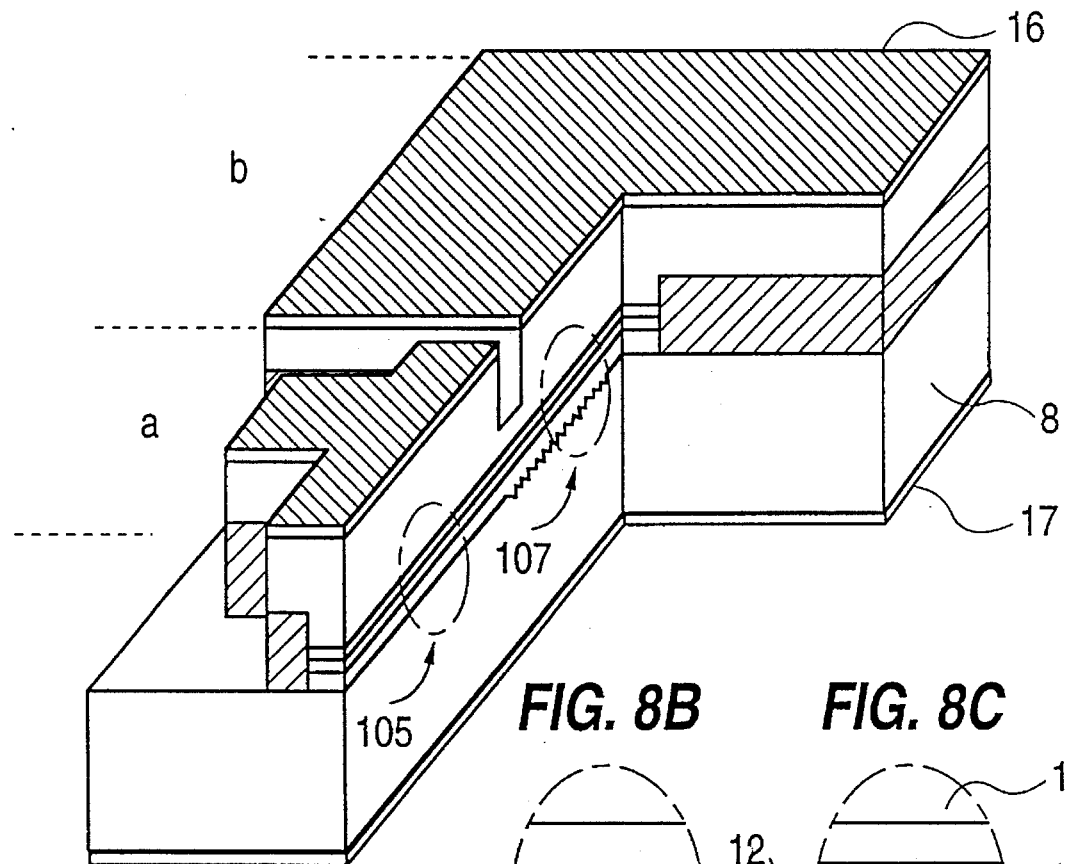
FIGS. 8A–8C are illustrations of a second embodiment of the present invention, with FIGS. 8B and 8C being sectional portions of FIG. 8A.
Figure 8B:
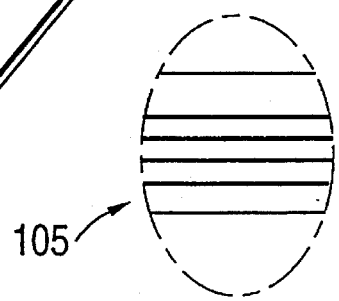
Figure 8C:
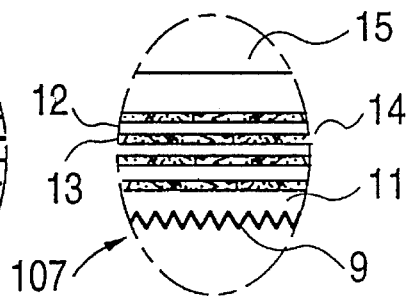

FIGS. 8A–8C show a device structure of a second embodiment, made by replacing the quantum well structure of the optical modulator of Embodiment 1, and the quantum well layer of the distributed feedback laser section of Embodiment 1, with quantum well structures 14 having tensile strains (Δa/a) of −1.5% and −1.0%, respectively, and further introducing a recessed structure and current constriction structure through a known method. The device of FIG. 8A has, in section "b", a tensile strain multiple quantum well distributed feedback laser with a gain peak wavelength of about 1.55 μm and a tensile strain of −1.0% and has, in section "a", a tensile strain multiple quantum well optical modulator with a gain peak wavelength of 1.48 μm and a tensile strain of −1.5%. FIGS. 8B and 8C respectively show section portions 105 and 107 of FIG. 8A, which respectively are portions of section "a" and of section "b". In this case, the oscillation light is of the TM mode, and a light hole band takes part in laser emission and light absorption instead of the existing heavy hole band. Therefore, it is possible to greatly improve the stability of laser oscillation wavelength, and greatly improve the modulation efficiency and speed of the modulator.

Embodiment 3

Figures 9A, 9B, 9C:
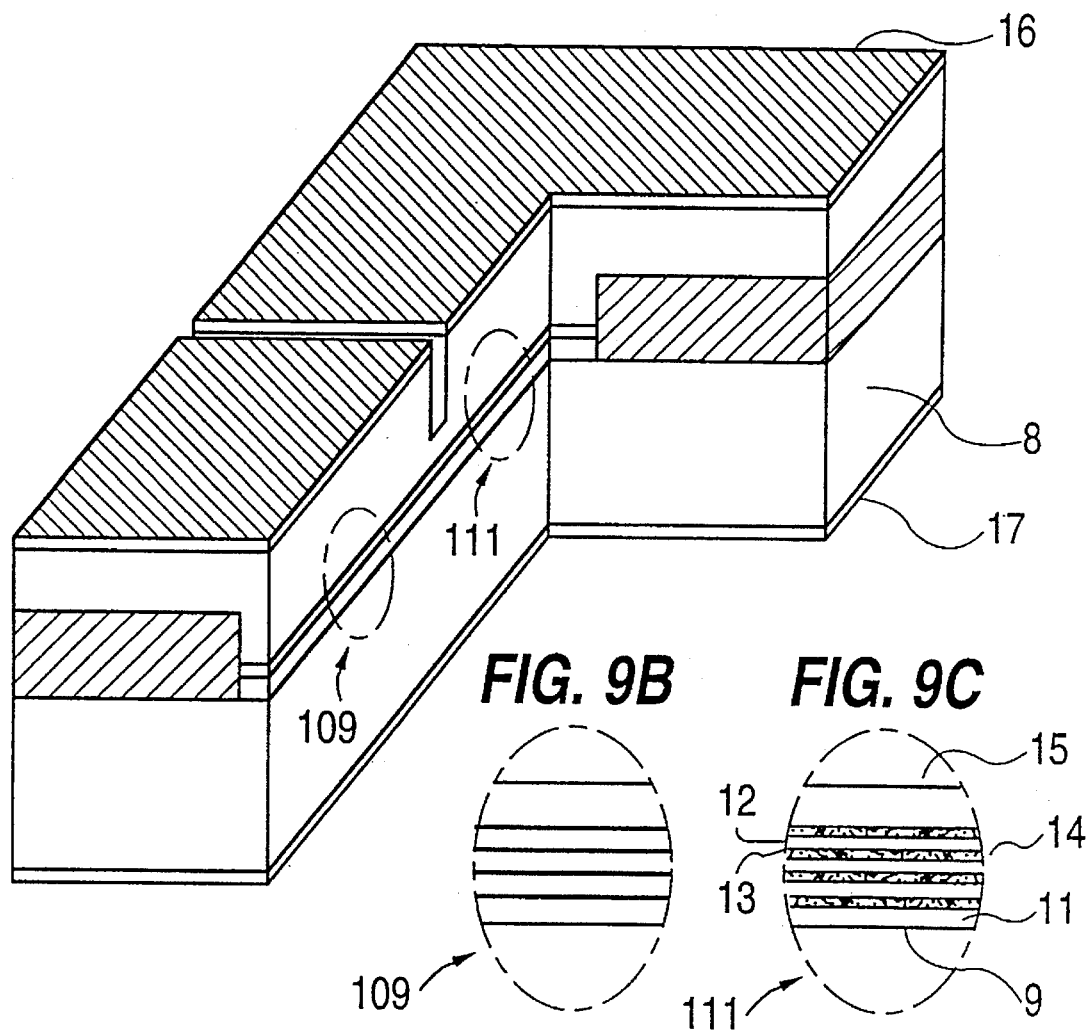
FIGS. 9A–9C are illustrations of a third embodiment of the present invention, with FIGS. 9B and 9C being sectional portions of FIG. 9A.

For the optical integrated device shown in FIGS. 9A–9C, the gain peak wavelength of two regions (portions being shown respectively as 109 and 111) is set to 1.50 μm and 1.55 μm, respectively, and the lattice distortion (strain) of the quantum well structures of these two regions is respectively a tensile strain and a compressive strain, set to −1.0% and +0.5%, respectively, through the technique the same as that of Embodiment 1. FIGS. 9B and 9C respectively show section portions 109 and 111 of FIG. 9A. After all of the semiconductor layers are formed, and etching and burying are performed, a separated p-electrode 16 and separated n-electrode 17 are provided through a conventional vapor deposition method, to obtain a semiconductor optical integrated device. An optical amplifier independent of polarization can very easily be realized by using the above structure for TE and TM mode optical amplifiers, respectively, and separately controlling the amplification factors in TE and TM modes through current injection. FIG. 9A shows the device structure of the embodiment made by further introducing a recessed structure and current constriction structure through a known method. Thereby, it is possible to completely eliminate polarization dependency from the optical amplifier. Moreover, it is possible to provide TE- and TM-mode filters by separately controlling the amplification factor and absorption coefficient in the TE or TM mode, through current injection or voltage application.

Embodiment 4

In FIGS. 10A–10C, an insulator patterning mask comprising $SiO_2$, $SiN_x$, or a-Si is formed on an n-InP semiconductor substrate, in which a width of a region where the first semiconductor substrate is exposed (growth region width) differs in the optical waveguide direction between a region where a grating 9 is formed and a region where it is not formed. FIGS. 10B and 10C respectively show section portions 113 and 115 of FIG. 10A. Then, an $In_{0.85}Ga_{0.15}As_{0.33}P_{0.67}$ quaternary waveguide layer 11, a multiple quantum well structure 14 comprising an $In_xGa_{1-x}As$ tertiary quantum well layer 12 and $In_{0.85}Ga_{0.15}As_{0.33}P_{0.67}$ quaternary quantum barrier layer 13, and a p-InP cladding layer 15 are crystal-grown in order on the substrate, through an organometallic vapor-phase epitaxy method. In this case, the compositions of the tertiary and quaternary crystals grown in the exposed area vary depending on the exposed area width of the patterning mask, as discussed previously in connection with FIG. 4. From FIG. 4, by setting the exposed area width of two regions, shown respectively in portions as 115 and 113, to 30 μm and 90 μm respectively, the gain peak wavelength is set to 1.25 μm and 1.55 μm, respectively, and the lattice strain (Δa/a) of the quantum well structures is set to −1% and +1%, respectively. After the semiconductor layers are formed, and etching and burying are performed as discussed in connection with Embodiment 1, a p-electrode 16 and n-electrode 17 are formed through a conventional vapor deposition method to obtain a semiconductor optical integrated device. A distributed reflective laser can be realized by using the above structure as a distributed Bragg reflector 18 and an active region 19. Region 50 is a phase control region. FIG. 10A shows the device structure of the embodiment made by further introducing a recessed structure and current constriction structure through a known method. In this case, because the distributed Bragg reflector 18 having a tensile strain has almost no loss for the TE light produced by the active region 19 having a compressive strain, it is possible to decrease an oscillation threshold and a spectral line width of the laser. A phase control region 50 is placed between the distributed Bragg reflector 18 and the active region 19 for maintaining a laser oscillation phase condition. For this embodiment, the active region is provided with a compressive-strain quantum well and the distributed Bragg reflector 18 is provided with a tensile-strain quantum well. The same effect can be obtained even by providing the active region with a tensile-strain quantum well and the distributed Bragg reflector 18 with a compressive-strain quantum well.

Embodiment 5

Figure 11A:
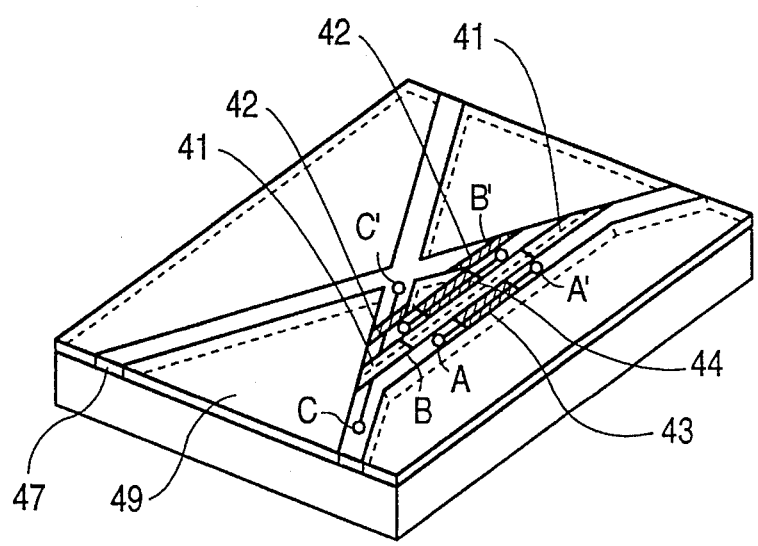
FIGS. 11A–11E are illustrations of a fifth embodiment of the present invention.
Figure 11B:
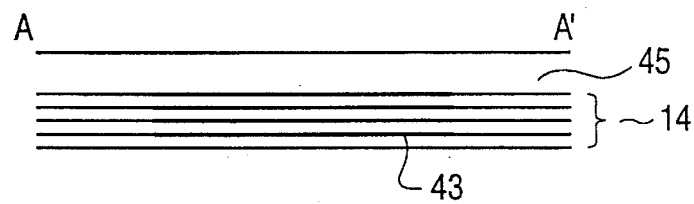
Figure 11C:
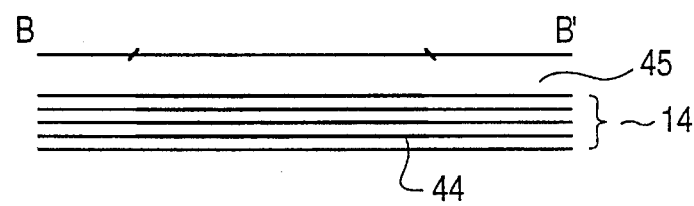
Figure 11D:
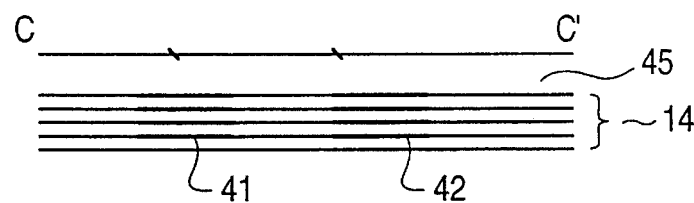
Figure 11E:
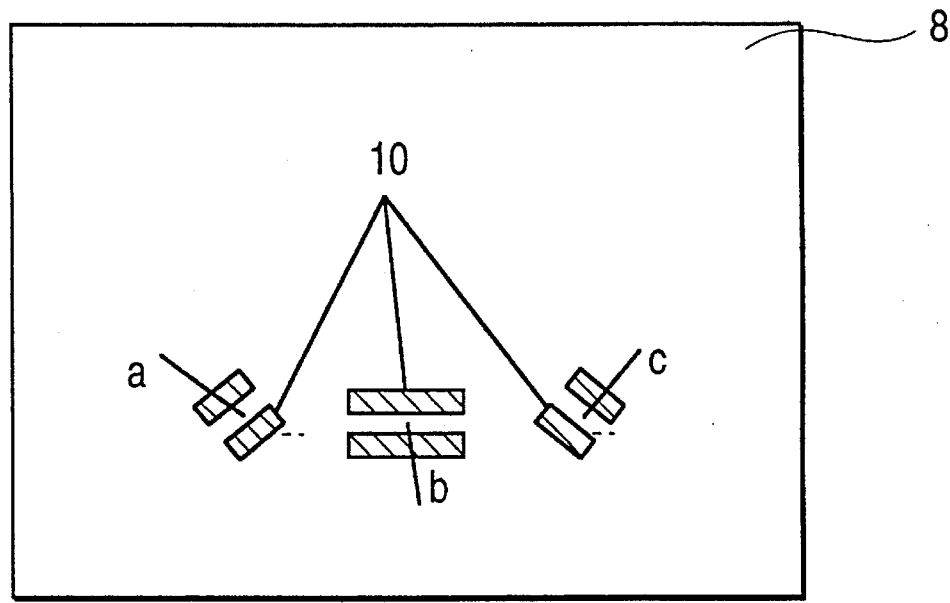

FIGS. 11A–11E show an embodiment of a crossover light switch made by integrating optical amplifiers according to the present invention. A multiple quantum well structure 14 with the gain peak wavelength of 1.45 μm and a tensile strain of −1% in a quantum well layer is formed on an n-InP substrate 8 having a patterning mask 10 comprising insulators such as $SiO_2$, $SiN_x$, and a-Si as shown in FIG. 11E. FIG. 11E shows patterning mask 10 for forming TM mode reflectors 42 and TM mode amplifier 44. In this case, and as seen from FIG. 11E, it is necessary to adjust the mask width and growth region width so that the sections "a" (TM mode reflector 42) and "c" (TM mode reflector 42) have a gain peak wavelength of 1.50 μm and a quantum well structure compressive strain of +0.5%, and the section "b" (TM mode amplifier 44) has a gain peak wavelength of 1.55 μm and a quantum well structure compressive strain of +1.0%.

FIG. 11A shows an embodiment of a device structure made by further introducing a recessed structure, waveguide structure, and current constriction structure through a known method. An X-shape ridge waveguide structure 47 has a first bypass waveguide and a second bypass waveguide. The first bypass waveguide includes a TE mode amplifier 43 as shown in FIG. 11B. The second bypass waveguide includes a TM mode amplifier 44 as shown in FIG. 11C. There is a TE mode reflector 41 at each of the intersections of the X-shape ridge waveguide and the first bypass waveguide. There is also a TM mode reflector 42 at each of the intersections of the X-shape ridge waveguide and the second bypass waveguide. The TE mode reflector 41 and TM mode reflector 42 are shown in FIG. 11D. Reference character 49 shows current constriction structure, and reference character 45 shows a low loss waveguide. Therefore, by arranging quantum well structures with compressive and tensile strains on the surface, the light reflector and light amplifier can separately be controlled for TE- and TM-mode polarization light, as shown in FIG. 11A. This embodiment makes it possible to very easily realize a light switch with a low loss and high extinction ratio, and completely independent of polarization.

Embodiment 6

Figure 12A:
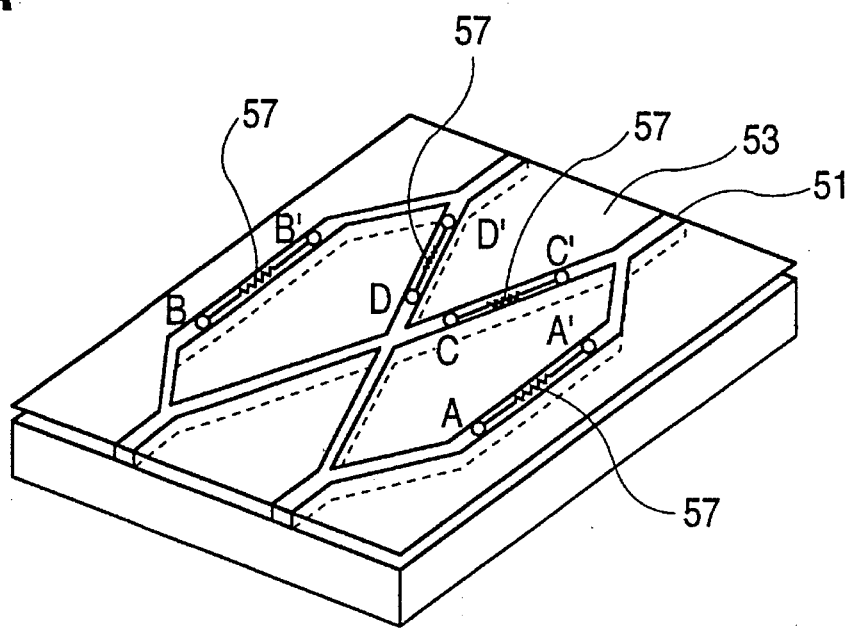
FIGS. 12A and 12B are illustrations of a sixth embodiment of the present invention.
Figure 12B:
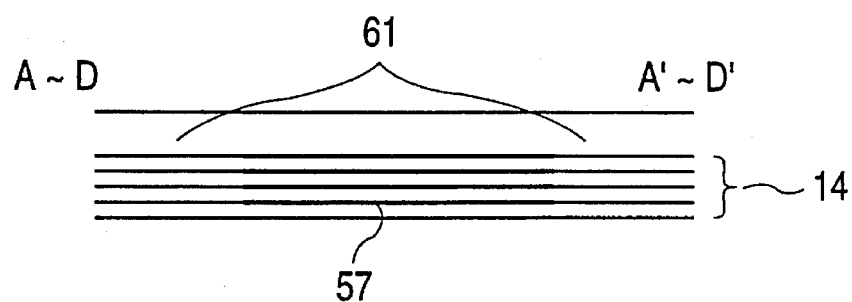

FIGS. 12A and 12B show another embodiment of a optical switch using an optical amplifier as a gate switch section. An InGaAs/InGaAsP multiple quantum well structure 14 with a gain peak wavelength of 1.45 μm and with a tensile strain of 1% in the well layer is grown on a partially $SiO_2$-masked n-InP substrate. By adjusting the dimension of the selective mask pattern, the gain peak wavelength of the gain switching section is set at 1.56 μm. FIG. 12A shows a completed device structure made by further introducing a ridge waveguide structure and current constriction structure through a known method. In FIG. 12A, shown are gain switching sections 57, ridge waveguide structure 51, and current constriction structure 53. FIG. 12B shows gain switching section 57 in multiple quantum well structure 14, with a low loss waveguide 61.

Using this embodiment, a very low-loss (or even an optical gain) and high on/off ratio (greater than 30 dB) optical switch can be achieved, in a simple method.

Embodiment 7

Figure 13:
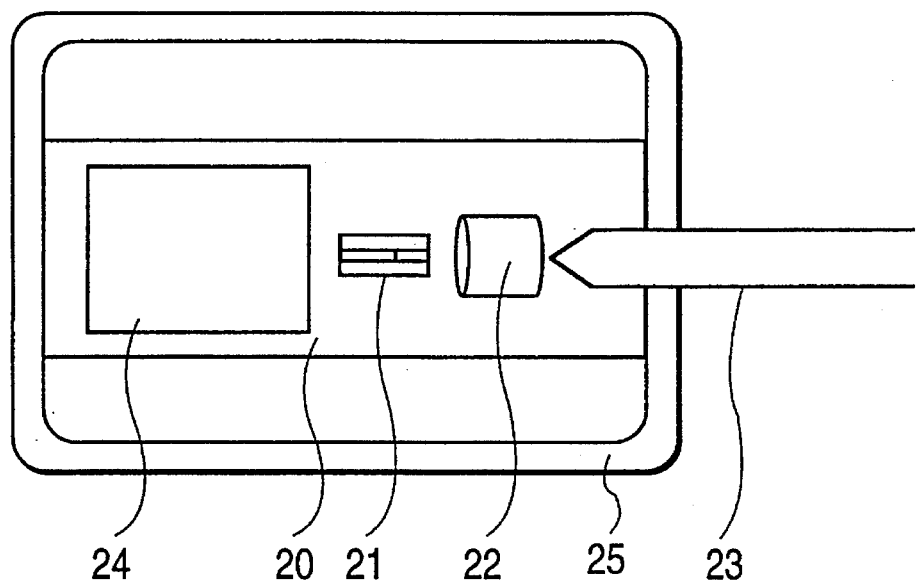
FIG. 13 is an illustration of a seventh embodiment of the present invention.

FIG. 13 shows an optical-communication transmitter module 25 made by securing the distributed feedback laser and modulator integrated light-source 21 of Embodiment 1 or 2 on a submount 20, also securing a lensed fiber 23 on the optical axis of the light source through a spherical lens 22, and further storing a driver IC 24 on the optical axis through a lensed fiber 23. This module makes it possible to easily generate high-speed transmission light signals with a high fiber optical output and a low chirping.

Embodiment 8

Figure 14:
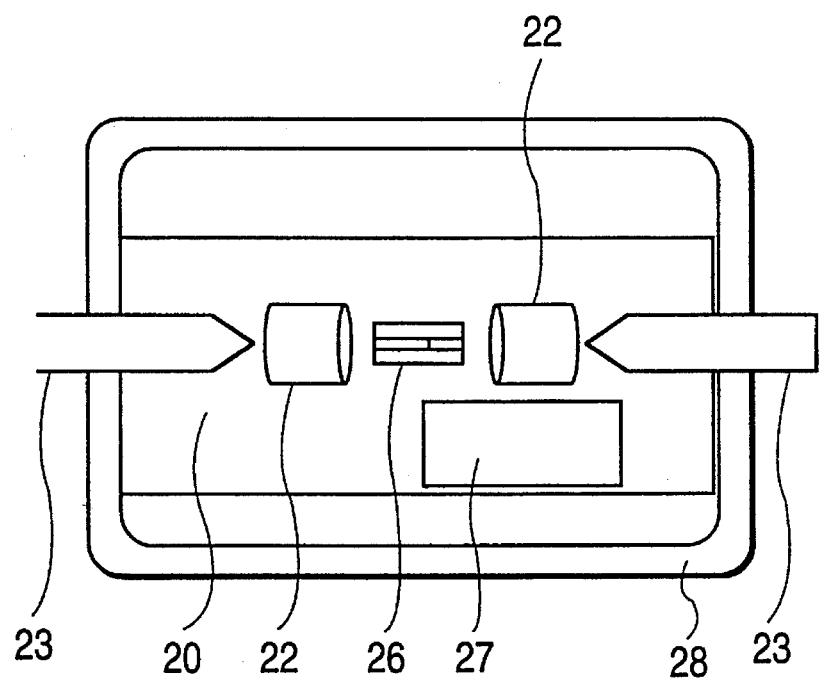
FIG. 14 is an illustration of an eighth embodiment of the present invention.

FIG. 14 shows an optical-communication repeater module 28 made by securing a polarization-independent optical amplifier 26 of Embodiment 3 on a submount 20, also securing two lensed fibers 23 on the optical axis of the amplifier each through a spherical lens 22, and further storing a module driver 27. This module makes it possible to very easily provide an optical repeater module completely independent of polarization by separately controlling the amplification factors in TE and TM modes.

Embodiment 9

Figure 15:
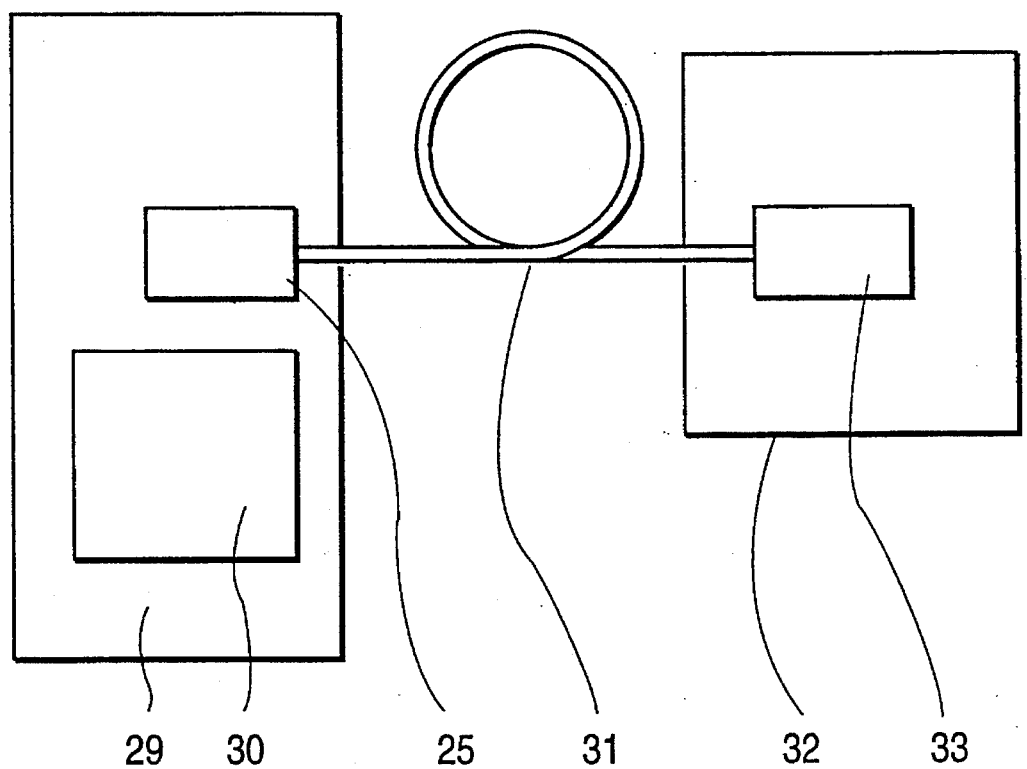
FIG. 15 is an illustration of a ninth embodiment of the present invention.

FIG. 15 shows a main optical communication system using the transmitter module 25 of Embodiment 7. An optical transmitter 29 has a transmitter module 25 and a driving system 30 for driving the module 25. The light signal outputted from the module 25 passes through an optical fiber 31 and is detected by a receiver module 33 of a receiver 32. The optical communication system according to this embodiment makes it possible to easily realize non-relay optical transmission of 100 km or more. This is because chirping is greatly decreased, and therefore signal degradation due to dispersion of the fiber 31 is also greatly decreased.

Embodiment 10

Embodiment 10 of the present invention is described below by referring to FIG. 16.

Figure 16:
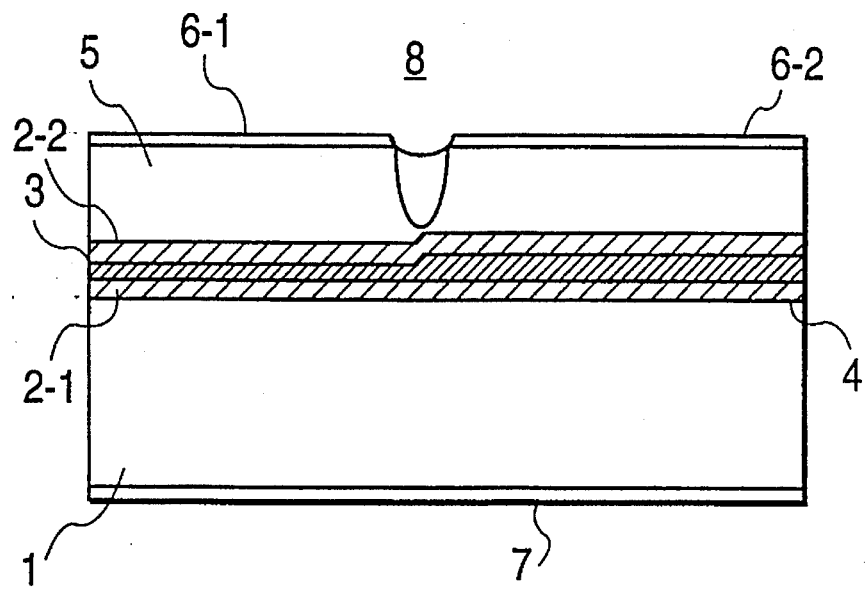
FIG. 16 is an illustration of light receiver structure, for polarized-wave diversity, according to a tenth embodiment of the present invention.

FIG. 16 is a schematic drawing of the structure of a waveguide-type light receiver for polarization diversity. An n-type InGaAsP waveguide layer 2-1, with a bottom band gap wavelength of 1.3 µm, is formed on an n-type InP substrate 1. Moreover, a multiple quantum-well TE-mode light-absorbing structure 3, which has a barrier layer comprising InGaAs which has a lattice constant equal to that of the substrate and a well layer comprising InGaAsP whose band gap wavelength is 1.3 µm, and which light-absorbing structure comprises five well layers, is formed on the guide layer 2-1. A top waveguide layer 2-2, comprising InGaAsP with a band gap wavelength of 1.3 µm, is formed on the structure 3. The absorption edge of the multiple quantum well is set to 1.58 µm. Part of the formed InGaAs layers and part of the formed InGaAsP layers are removed with a selective etching liquid, a bottom waveguide layer 2-1 is formed again, and a TM-mode absorbing layer 4 comprising InGaAs bulk crystal and a top waveguide layer 2-2 are formed in the etched region on the layer 2-1. Then, a p-type InP layer 5 is formed, and then a groove 8 for electrical isolation is formed to form electrodes 6-1 and 6-2 in the TE- and TM-mode absorbing regions respectively. Finally, an n-electrode 7 is formed at the back. As the result of applying light with a wavelength of 1.55 µm which accepts absorption for TE mode of the quantum well absorbing layer 3 but does not absorb TM-mode light, changing the incident polarized light, and comparing the electric signal output of each region, a conversion ratio of 95:1 is obtained between TE-mode polarized light and TM-mode polarized light. The transmitted TM-mode light is converted into electric Signals in the InGaAs absorbing layer.

Embodiment 11

Figure 17:
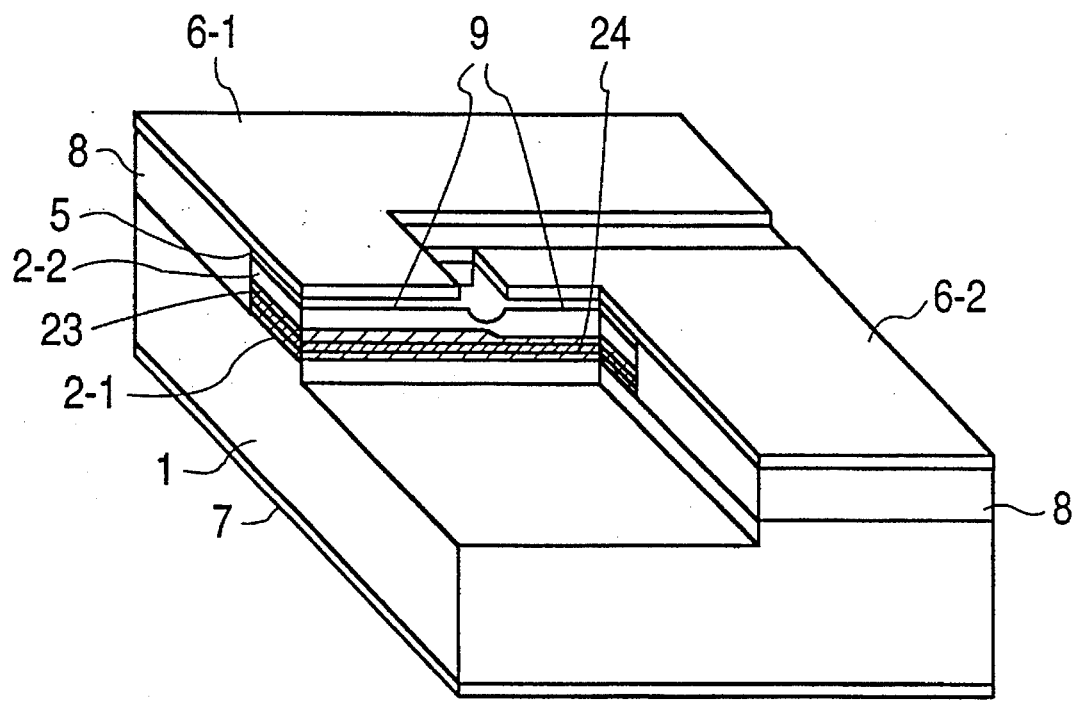
FIG. 17 is an illustration of a strain superlattice of a waveguide-type light receiver for polarization diversity.

An embodiment using a strain superlattice (quantum well structure) is described below by referring to FIG. 17. FIG. 17 is a perspective view of a waveguide-type light receiver for polarization diversity. Absorbing layers 23 and 24, comprising two different strain superlattices, are formed with a butt joint in series on an InGaAsP waveguide layer 2-1, with a thickness of 0.6 µm and a band gap wavelength of 1.3 µm, on an n-type InP substrate 1. The first absorbing layer 23 is made by forming five InGaAs well layers, whose lattice constant is 1% larger than that of InP, as compressive strain absorbing layers. In this case, the quantum-well band gap wavelength is 1.60 µm for TE-mode light. The second absorbing layer 24 is made by forming one InGaAs well layer whose lattice constant is 1% smaller than that of InP. The lattice constant of the first absorbing layer 23 is larger than that of the second absorbing layer 24. Then, an InGaAsP top waveguide layer 2-2, with a thickness of 0.6 µm and a band gap wavelength of 1.3 µm, a p-type InP layer 5, and a p-type InGaAsP cap layer 9 are formed on the absorbing layer. To electrically separate the two different absorbing layers 23 and 24 from each other, etching is performed to remove up to the middle of the p-type InP layer, to form a separation groove at the boundary between the two layers. Then, etching is performed to form a waveguide of a high mesa structure, with a width of 4 µm. Polyimide 8 is applied to the etched region, to flatten its surface. The p-electrodes 6-1 and 6-2 are independently formed in each absorbing region. Finally, an electrode 7 is formed at the back. For this light receiver, the absorbing ratio between TE and TM modes is improved to 99:1 in the TE-mode selectively-absorbing region. Accordingly, the propagation loss of TM-mode light is decreased, and the conversion efficiency of it is improved in the TE-mode absorbing region. Moreover, the influence of residual TE-mode light in the TM-mode light receiving region is decreased to ½ or less, as compared with Embodiment 10.

Figure 18:
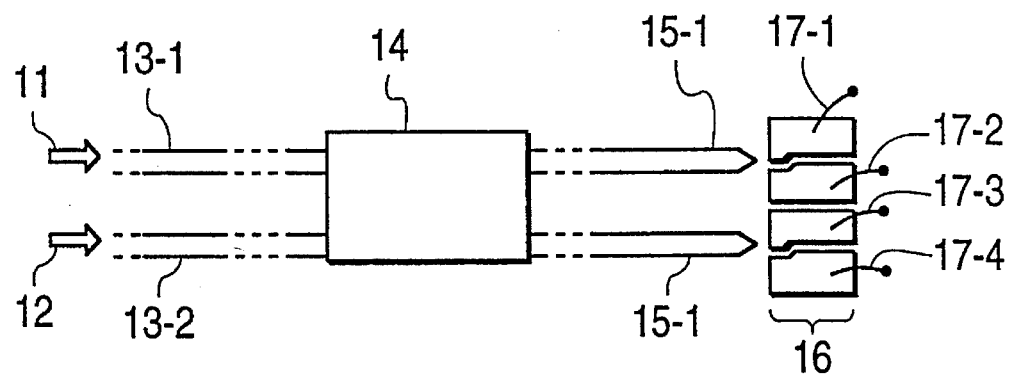
FIG. 18 illustrates use of a light-receiver in a system providing polarized-wave diversity.

The following is an example of using the light receiver. FIG. 18 shows a polarization diversity system using the waveguide-type light receiver. This system uses the balance-type technique. Locally-oscillated light 11 is coupled with one input of an optical coupler 14, of a polarized-wave storing type, via a polarized-wave holding optical fiber 13-1, and transmitted signal light 12 is coupled with the other input via optical fiber 13-2. In this case, the polarized light of the locally-oscillated light 11 is adjusted to the optical axis of the polarized-wave holding optical fiber 13-1. The optical axes of output fibers 15-1 and 15-2 of the optical coupler are coupled with a light receiver 16 by adjusting the polarized light of the output light of the optical coupler 14 so that the axes are tilted by 45° (45° for TE or TM mode) from the surface of the waveguide-type light receiver 16. TE-mode absorbing electrodes are 17-1 and 17-3, to which a reverse bias is applied. A reverse bias is also applied to TM-mode absorbing electrodes 17-2 and 17-4. Polarization diversity is achieved by adding signals outputted from the electrodes 17-1 and 17-2. The same is true for the electrodes 17-3 and 17-4. Signals uniformly amplified by locally-oscillated light are obtained for the polarized light of any signal light. Thus, the polarization diversity system is greatly simplified. Moreover, a balance-type receiver is achieved, and noise of the locally-oscillated light 11 is removed. As described above, a receiving system for coherent optical communication can be achieved using only a polarized-wave holding-type optical coupler 14 and the light receiver.

For this waveguide-type receiving system, the absorption coefficient and loss depend on a wavelength. Therefore, it is necessary to make a correction between the signal intensity of TE- and TM-mode lights and the obtained electric signal intensity, in order to make the system function as a polarization diversity. For this, there is a method for equalizing each polarized-light signal intensity by equalizing the amplification factor of electric signals between the TE-mode signal outputs 17-1 and 17-3 on one hand and the TM-mode signal outputs 17-2 and 17-4 on the other. The set wavelength and strain of the absorbing layer are restricted by the lattice constant of the InP substrate. As a result, the conversion efficiency between TE- and TM-mode lights may not be equalized, depending on the wavelength of the signal light. In this case, the angle of incident polarized light to the optical waveguide of locally-oscillated light is deviated from 45°. For this embodiment, when the Wavelength of the signal light is 1.53 µm, polarized-light selectivity may decrease because the ratio of TE-mode absorption factor to TM-mode light absorption factor comes to 20:1 in the TE-mode light selectively-absorbing region. This is because TM-mode light is lost in the TE-mode light selectively-absorbing region. To compensate for the loss, the TM-mode polarized-light component of incident locally-oscillated light is increased by deviating such component, from an angle of 45°, by an angle such that the component increases (e.g., by deviating from an angle of 45° by 1.5°).

The present invention makes it possible to greatly improve the performance of a semiconductor optical device by integrating a plurality of quantum well structures with different strains and/or lattice mismatch degree (e.g., compressive strain/tensile strain). The semiconductor optical integrated device fabrication method according to the present invention makes it possible to realize a plurality of quantum well structures whose strain and/or lattice mismatch degree (e.g., compressive strain/tensile strain) differ on a same substrate surface. Moreover, it is possible to provide a new optical integrated device capable of controlling any polarization surface of the activating light. Furthermore, the present invention provides structure, and a method of manufacture, combining a plurality of quantum well structures with different strains and/or lattice mismatch on a substrate (e.g., single substrate), and provides for integrating optical waveguides with different polarization dependencies.

The present invention requires no beam splitter for polarized-wave separation, and greatly simplifies the structure of a polarization diversity optical system for a coherent optical communication. As a result, reliability is improved and the receiving system can be downsized.

While we have shown and described several embodiments in accordance with the present invention, it is understood that the same is not limited thereto, but is susceptible to numerous changes and modifications as known to one having ordinary skill in the art, and we therefore do not wish to be limited to the details shown and described herein, but intend to cover all such modifications as are encompassed by the scope of the appended claims.

What is claimed:

1. A semiconductor optical integrated device comprising at least a first optical functional section having a first optical waveguide structure comprising a first compound semiconductor material and a second optical functional section having a second optical waveguide structure comprising a second compound semiconductor material, the first and second optical waveguide structures being provided laterally on a same substrate, wherein the first optical waveguide structure is continuous with the second optical waveguide structure on the substrate, and wherein a lattice mismatch of crystal growth films of the first optical waveguide structure, on the substrate, differs from a lattice mismatch of crystal growth films of the second optical waveguide structure, on the substrate.

2. The semiconductor optical integrated device according to claim 1, wherein the first and second compound semiconductor materials have different compositions.

3. The semiconductor optical integrated device according to claim 1, wherein the first and second compound semiconductor materials are each Group III-V compound semiconductor materials, the Group III elements including In and at least one of Ga and Al.

4. The semiconductor optical integrated device according to claim 1, wherein the first and second compound semiconductor materials are each Group III-V compound semiconductor materials, the Group III elements including at least one Group III element having a larger diameter than at least one other Group III element.

5. The semiconductor optical integrated device according to claim 1, wherein the first and second optical waveguide structures respectively include first and second quantum well structures, the first and second quantum well structures being quantum well structures formed by providing a substrate having insulating layer patterning masks thereon, said patterning masks exposing growth regions of the substrate on which the quantum well structures are deposited, with at least one of (a) growth regions for different quantum well structures having different widths and (b) respective patterning masks, exposing different growth regions, having different widths; and simultaneously depositing material of the quantum well structures on the growth regions.

6. The semiconductor optical integrated device according to claim 5, wherein the growth regions have different widths on which the first quantum well structure and the second quantum well structure are respectively formed.

7. The semiconductor optical integrated device according to claim 6, wherein respective patterning masks, for exposing first and second growth regions on which are deposited respectively the first and second quantum well structures, have different widths.

8. The semiconductor optical integrated device according to claim 7, wherein the growth regions on which the first and second quantum well structures are respectively formed each has a same width.

9. The semiconductor optical integrated device according to claim 5, wherein the growth regions have a width of 5–30 µm.

10. The semiconductor optical integrated device according to claim 9, wherein the insulating layer patterning masks have a width of 5–60 µm.

11. The semiconductor optical integrated device according to claim 5, wherein the insulating layer patterning masks have a width of 5–60 µm.

12. The semiconductor optical integrated device according to claim 1, wherein each of the first and second optical waveguide structures include quantum well structure provided overlying the substrate.

13. The semiconductor optical integrated device according to claim 5, wherein at least one of the first and second optical waveguide structures includes an optical waveguide layer provided between the substrate and the quantum well structure.

14. A semiconductor optical integrated device comprising at least a first optical functional section having a first optical waveguide structure comprising a first compound semiconductor material and a second optical functional section adjacent to the first optical functional section laterally on a same substrate, the second optical functional section having a second optical waveguide structure comprising a second compound semiconductor material, wherein the first optical waveguide structure is continuous with the second optical waveguide structure on the substrate, and wherein a strain of the first optical waveguide structure is different from a strain of the second optical waveguide structure.

15. The semiconductor optical integrated device according to claim 14, wherein the first and second optical waveguide structures respectively include first and second quantum well structures, the respective quantum well structures having the different strains.

16. The semiconductor optical integrated device according to claim 14, wherein one of the first and second optical waveguide structures has a compressive strain, and the other of the first and second optical waveguide structures has a tensile strain.

17. A semiconductor optical integrated device according to claim 14, wherein a gain of the first optical functional section is more than 0 and that of the second optical functional section is 0 or less.

18. A semiconductor optical integrated device according to claim 14, wherein gains of the first and second optical functional sections are each more than 0.

19. A semiconductor optical integrated device according to claim 14, wherein a gain of the first optical functional section is 0 or less and that of the second optical functional section is more than 0.

20. Product formed by the method comprising the steps of:

providing a single substrate having respective growth regions for growing laterally thereon at least first and second optical waveguide structures of at least first and second optical functional sections, respectively, the first and second optical waveguide structures respectively comprising first and second compound semiconductor materials; and growing said first and second optical waveguide structures, said growing including forming continuous to each other first and second crystal layers respectively of the first and second optical waveguide structures, the first and second crystal layers respectively of the first and second optical waveguide structures each having a lattice mismatch with the substrate, the lattice mismatch between the first crystal layer and the substrate differing from the lattice mismatch between the second crystal layer and the substrate.

21. A semiconductor optical integrated device according to claim 1, wherein the first optical waveguide structure and the second optical waveguide structure are structures formed simultaneously on the substrate.

22. A semiconductor optical integrated device according to claim 14, wherein the first optical waveguide structure and the second optical waveguide structure are structures formed simultaneously on the substrate.

23. Product according to claim 20, wherein said first and second optical waveguide structures are structures formed simultaneously on the single substrate.

* * * * *